United States Patent
de Vreede et al.

(10) Patent No.: US 9,825,593 B2
(45) Date of Patent: Nov. 21, 2017

(54) HIGHLY LINEAR, HIGHLY EFFICIENT WIDEBAND RF POWER AMPLIFIER HAVING WIDE VIDEO BANDWIDTH CAPABILITY

(71) Applicant: Technische Universiteit Delft, Delft (NL)

(72) Inventors: Leonardus C. N. de Vreede, Delft (NL); Earl W. McCune, Jr., Santa Clara, CA (US)

(73) Assignee: Technische Universiteit Delft, Delft (NL)

( * ) Notice: Subject to any disclaimer, the term of this patent is extended or adjusted under 35 U.S.C. 154(b) by 0 days.

(21) Appl. No.: 15/071,350

(22) Filed: Mar. 16, 2016

(65) Prior Publication Data
US 2017/0272037 A1    Sep. 21, 2017

(51) Int. Cl.
H03F 1/02 (2006.01)
H03F 3/19 (2006.01)
H03F 3/21 (2006.01)

(52) U.S. Cl.
CPC ............ *H03F 1/0288* (2013.01); *H03F 3/19* (2013.01); *H03F 3/21* (2013.01); *H03F 2200/36* (2013.01); *H03F 2200/451* (2013.01)

(58) Field of Classification Search
CPC ................................. H03F 1/02; H03F 3/19
USPC .............................................. 330/295, 124 R
See application file for complete search history.

(56) References Cited

U.S. PATENT DOCUMENTS

| 5,973,557 | A | * | 10/1999 | Miyaji | H03F 1/0277 330/124 R |
|---|---|---|---|---|---|
| 6,078,169 | A | | 6/2000 | Petersen | |
| 6,288,606 | B1 | * | 9/2001 | Ekman | H03G 1/0088 330/107 |
| 7,170,341 | B2 | * | 1/2007 | Conrad | H03F 1/02 330/296 |
| 8,653,887 | B2 | * | 2/2014 | Hellberg | H03F 1/0277 330/124 R |

(Continued)

OTHER PUBLICATIONS

R. Darraji et al., "Digital Doherty Amplifier With Enhanced Efficiency and Extended Range," IEEE Transactions on Microwave Theory and Techniques, pp. 2898-2909, vol. 59, No. 11, Nov. 2011.

(Continued)

*Primary Examiner* — Patricia T Nguyen
(74) *Attorney, Agent, or Firm* — Patent Law Professionals, P.C.; William E. Winters

(57) ABSTRACT

A radio frequency power amplifier (RF PA) apparatus includes a first RF PA, a second RF PA, and a controller. The first RF PA is configured to deliver RF power to a load over a first range of RF power levels. The second RF PA is configured to deliver RF power to the load over a second range of RF power levels greater than the first range of RF power levels. The controller controls whether the first RF PA is delivering RF power to the load or the second RF PA is delivering RF power to the load, and is further configured to coordinate and control handoffs between the first and second RF PAs by varying magnitudes of input RF voltages applied to the RF input ports of the first and second RF PAs or by varying magnitudes of input bias voltages applied to the RF input ports of the first and second RF PAs.

28 Claims, 21 Drawing Sheets

(56) References Cited

U.S. PATENT DOCUMENTS

| | | | | |
|---|---|---|---|---|
| 2006/0061417 A1* | 3/2006 | Ohnishi | ................ | H03F 1/0277 |
| | | | | 330/51 |
| 2006/0164163 A1* | 7/2006 | Apel | ..................... | H03F 1/0277 |
| | | | | 330/151 |
| 2010/0060354 A1* | 3/2010 | Maeda | ....................... | H03F 1/42 |
| | | | | 330/124 R |
| 2010/0301947 A1* | 12/2010 | Fujioka | ................ | H03F 1/0266 |
| | | | | 330/295 |

OTHER PUBLICATIONS

Written Opinion from Int'l Searching Authority (ISA), PCT Appl. No. PCT/IB2017/051542.

* cited by examiner

HIGHLY LINEAR, HIGHLY EFFICIENT WIDEBAND RF POWER AMPLIFIER HAVING WIDE VIDEO BANDWIDTH CAPABILITY

FIELD OF THE INVENTION

The present invention relates to radio frequency power amplifiers (RF PAs).

BACKGROUND OF THE INVENTION

Two principal goals normally involved in the design of a radio frequency (RF) transmitter are linearity and efficiency. These goals are substantially impacted by the design and operation of the RF transmitter's power amplifier (RF PA). RF PA linearity refers to how capable the RF PA is at producing a linear reproduction of the RF signal applied to its input. RF PA efficiency refers to how energy efficient the RF PA is at converting power supplied to it from its power supply into RF power. Unfortunately, due to physical limitations of the power transistors that make up RF PAs and how the power transistors operate, designing an RF PA that is both highly linear and highly efficient is very difficult.

A third goal often involved in the design of an RF PA is to make the RF PA so that it is capable of operating over a wide range of frequencies and has a wide video bandwidth capability. Designing an RF PA that is capable of operating with high linearity and high efficiency at a specific frequency or over a narrow range of frequencies is difficult by itself. Designing an RF PA that is capable of operating with high linearity and high efficiency over a wide range of operating frequencies and which also has a wide video bandwidth capability is even more, in fact is considerably more, difficult.

To highlight some of the difficulties and challenges involved in designing an RF PA having high linearity, high efficiency, and wide operational and video bandwidth capabilities, reference is first made to FIG. 1, which is a schematic drawing of a conventional RF PA 100 configured for Class-A operation. The Class-A RF PA 100 comprises a power transistor 102 having a collector (or drain, if the power transistor is a field-effect transistor, instead of bipolar junction transistor) configured to receive a power supply voltage $V_{CC}$. An inductor 104 in the collector path serves as an RF choke that prevents RF energy produced by the RF PA 100 from entering and disrupting the collector power supply. The base of the power transistor 102 is biased by a DC bias voltage $V_{BB}$, which centers the operating point 202 of the Class-A RF PA 100 near the center of the active region of the I-V characteristic curves of the power transistor 102 (see FIG. 2). The DC bias voltage $V_{BB}$ and collector supply voltage $V_{CC}$ are set, and the peak-to-peak variation of the magnitude of the input RF voltage $v_{in}$ is controlled, so that the RF PA 100 operates about the operating point 202, along a load line 204, exclusively in the active region of the characteristic curves, and preferably never in the saturation and cutoff regions. In this manner, the RF PA 100 is able to produce an RF output voltage $v_{out}$ that is a linear reproduction of the applied input RF voltage $v_{in}$.

The Class-A RF PA 100 is highly linear. However, unfortunately, it is also highly inefficient. Achieving high linearity (Class-A operation) requires that the RF PA's operating point 202 be positioned near the center of the active region of its power transistor's I-V characteristic curves. Unfortunately, this requirement undesirably results in the power transistor 102 dissipating large amounts of quiescent power. This problem is highlighted in FIG. 3, where it can be seen that the power transistor 102 in a Class-A operation conducts at all times, with a large DC quiescent current $I_{CQ}$ flowing through it at all times, regardless of what the magnitude of the AC component of the collector current $i_C$ is. High linearity is therefore obtained at the expense of efficiency. In fact, it can be shown that the maximum realizable conversion efficiency of the conventional Class-A RF PA 100 is only 50%, meaning that at least half the DC power supplied to it from its power supply is dissipated by the power transistor 102 in the form of heat. This low conversion efficiency is highly undesirable, particularly in circumstances where the power supply is a battery, such as in a wireless handset, for example, since the low conversion efficiency substantially limits the charge life of the battery.

One way to avoid the low conversion efficiency problem that plagues the Class-A RF PA 100 is to employ a Class-B RF PA, instead. In a Class-B RF PA the RF PA is biased so that the DC operating point is positioned at the boundary of the active and cutoff regions of its power transistor, as illustrated in FIG. 4, rather than in the center of the active region of the I-V characteristic curves, as in Class-A operation. The benefit of this approach is that the collector current $i_C$ is zero when the input RF voltage $v_{in}$ is zero. In other words, the quiescent current in for Class-B operation is $I_{CQ} \approx 0$.

One consequence of biasing the RF PA at the boundary of the active and cutoff regions, however, is that the RF PA then only becomes capable of amplifying the positive portions of the RF input. In other words, as illustrated in FIG. 5, the conduction angle of the Class-B RF PA is reduced from a conduction angle of $2\pi$ (as in Class-A operation (see FIG. 3)) to $\pi$ (see FIG. 5). So that the full collector current waveform can be produced at the output, the Class-B RF PA can be constructed using two power transistors—one for amplifying the positive portion of the RF input and the other for amplifying the negative portion. This so-called "push-pull" operation is illustrated in FIG. 6. A typical push-pull RF PA 600 comprises a first power transistor 602 (e.g., first BJT), a second power transistor 604 (e.g., a second BJT), a center-tapped input transformer 606, and a center-tapped output transformer 608. The first and second power transistors 602 and 604 have identical operating characteristics and, as illustrated in the I-V characteristic curves in FIG. 7, are biased by a DC bias voltage $V_{BB}$ at the boundary of their active and cutoff regions for Class-B operation. The bases of the first and second power transistors 602 and 604 are both configured to receive an input RF voltage $v_{in}$ from the secondary winding of the center-tapped input transformer 606, but 180° out of phase. When the RF input to the Class-B RF PA 600 is a sinusoid, the two collector currents $i_{C1}$ and $i_{C2}$ produced in the first and second power transistors 602 and 604 are half-wave rectified amplified versions of the sinusoidal input current $i_{in}$. The collector currents $i_{C1}$ and $i_{C2}$ flow through the primary winding of the output transformer 608, where they add together. The summed collector current flowing through the primary winding results in a load current $i_L$ being induced in the secondary winding of the output transformer 608. As illustrated in FIG. 8, the load current $i_L$ is a full-wave rectified sinusoid. Since the load current $i_L$ is a full-wave rectified sinusoid so too then is the RF output voltage $v_{out}$.

Because $I_{CQ1} = I_{CQ2} \approx 0$ in the Class-B RF PA 600, the power transistors 602 and 604 dissipate very little power in the quiescent condition. The Class-B RF PA 600 therefore has a significantly higher conversion efficiency compared to the Class-A RF PA 100. In fact, ignoring power dissipated by its biasing circuits and other non-ideal losses, it can be shown that the Class-B RF PA 600 obtains a maximum conversion efficiency of $\eta=P_{out}(RF)/P_{DC}=\pi/4=78.5\%$.

Although the Class-B RF PA 600 has a maximum conversion efficiency of $\eta=\pi/4$, this maximum conversion efficiency can only be approached in situations where the peak amplitude of the RF input voltage $v_{in}$ does not vary over time, i.e., in situations where the RF input $v_{in}$ voltage has a "constant envelope." Many modern wireless communications standards such as, for example, Wideband Code Division Multiple Access (WCDMA), Worldwide Interoperability for Microwave Access (WiMAX), Long Term Evolution (LTE) employ nonconstant envelope modulation schemes in which both the amplitude and angle (i.e., phase and/or frequency) of the RF output are varied to increase the amount of data that can be transmitted in a given portion of the RF spectrum. As illustrated in FIG. 9, the signal envelope 902 of an RF output signal $RF_{OUT}$ that has been modulated according to a nonconstant envelope modulation scheme has a nonconstant envelope, with a peak-to-average power ratio (PAPR) determined by the particular modulation scheme being employed. So that the RF PA does not clip the signal peaks of these nonconstant-envelope signals, the RF output power of the RF PA must be backed off by at least the amount of PAPR. Unfortunately, this back-off requirement can substantially limit the realizable conversion efficiency of the Class-B RF PA 600, especially in circumstances where the PAPR is high. In fact, for a PAPR=6 dB, the 6 dB back-off requirement results in the Class-B RF PA 600 only achieving a maximum possible efficiency of less than 40%.

Various prior art approaches have been proposed to increase the low conversion efficiency of the Class-B RF PA 600 when operating at backed-off power levels. One approach is the Doherty RF PA. FIG. 10 is a drawing showing the salient elements of the conventional Doherty RF PA 1000. The Doherty RF PA 1000 comprises a power divider 1002; a carrier (i.e., main) RF PA 1004; a peaking (i.e., auxiliary) RF PA 1006; a first and second quarter-wave impedance inverters 1008 and 1010; and a quarter-wave impedance transformer 1012. The carrier RF PA 1004 is biased for Class-B operation and the peaking RF PA 1006 is biased for Class-C operation. (Note that in Class-C operation the RF PA 1006 is biased fully in the cutoff region, rather than at the boundary of the active and cutoff regions as in Class-B operation, i.e., so that the conduction angle is less than n.) When the Doherty RF PA 1000 is operating at low RF output power levels only the carrier RF PA 1004 is active. The peaking RF PA 1006 remains cut-off and appears as an open circuit to the carrier RF PA 1004. With the peaking RF PA 1006 off, the quarter-wave impedance transformer 1012 and second quarter-wave impedance inverter 1010 together serve to increase the load impedance seen by the carrier RF PA 1004 to $R_1=2R_L=100\Omega$. The increased load impedance allows the carrier RF PA 1004 to reach full voltage swing at half power. The Doherty RF PA 100 therefore operates twice as efficiently at low RF output power levels than does the conventional Class-B RF PA and at a back-off power level of −6 dB achieves a maximum possible conversion efficiency of $\eta=\pi/4$, as shown in FIG. 11. As the RF input drive to the Doherty RF PA 1000 increases to a value that causes the RF output power to increase above the −6 dB back-off point, the peaking RF PA 1006 begins to turn on and the carrier RF PA 1004 saturates. (Note that the first quarter-wave impedance inverter 1008 is used to compensate for the 90° phase shift of the carrier RF PA 1004 output caused by the second quarter-wave impedance inverter 1010.) As the RF input drive continues to rise above the −6 dB back-off point, the peaking RF PA 1006 injects more and more current into the load $R_L$. Since the carrier RF PA 1004 is saturated above the −6 dB back-off point, if the second quarter-wave impedance inverter 1010 was not to be present the increasing current being injected by the peaking RF PA 1008 would result in the carrier RF PA 1004 seeing an increasing effective load impedance. However, because the second quarter-wave impedance inverter 1010 is present it operates to actually lower the effective load impedance seen by the carrier RF PA 1004, lowering it from the $R_1=2R_L=100\Omega$ maximum value during times when the peaking RF PA 1004 was off to lower and lower values. The lowering effective load impedance seen by the carrier RF PA 1004 allows the carrier RF PA 1004 to increase the amount of power it delivers to the load $R_L$, despite being saturated. The second quarter-wave impedance inverter 1010 also serves to transform the output impedance of the carrier RF PA 1004 to a higher value at its output end, thus allowing the peaking RF PA 1006 to efficiently pump power into the load $R_L$ as the input drive continues to rise. At PEP the carrier and peaking RF PAs 1004 and 1006 both see a 50Ω load, each contributes half the overall RF output power, and the overall conversion efficiency of the Doherty RF PA 100 is the same as the non-backed-off conventional Class-B RF PA (i.e., $\eta=\pi/4$). As illustrated in FIG. 11, the load modulation principle exploited by the Doherty RF PA 1000 allows the Doherty RF PA 1000 to achieve a maximum conversion efficiency of $\eta=\pi/4$ at both the −6 dB back-off point and the PEP output point while maintaining a relatively high conversion efficiency in between.

Although the Doherty RF PA 1000 is able to increase conversion efficiencies at backed-off power levels over that which can be realized in the conventional Class-B RF PA 600, it has a number of significant limitations. First, the impedance inverters 1008 and 1010 and impedance transformer 1012 are frequency dependent and consequently limit the possible tuning bandwidth of the Doherty RF PA 1000. These frequency dependent constraints are a significant problem since many modern and evolving communications standards require an RF PA with a tuning bandwidth up to, and in some cases exceeding, 100 MHz. The conventional Doherty RF PA 1000 does not provide this tuning bandwidth capability. Second, although the Doherty RF PA 1000 can achieve higher conversion efficiencies in back-off conditions, to achieve high linearity it requires resonator circuits to filter out unwanted harmonics generated by the nonlinear operation of the Class-B and Class-C carrier and peaking RF PAs 1004 and 1006, and carefully implemented predistortion processes in order to satisfy strict spectral mask requirements. Finally, the Doherty RF PA 1000 is very sensitive to changing load or changing antenna impedances. This sensitivity is a severe problem when applied in mobile handsets, where the effective antenna impedance is influenced by the changing operating environment. Additionally, this load sensitivity of the Doherty RF PA 1000 is problematic in applications intended to support carrier aggregation techniques, such as in the LTE Advanced (LTE-A) mobile communications standard. In such applications some kind of antenna impedance control to handle the total composite signal over the band can have a dramatic impact on the handling of the individual signals yielding undesirable distortion.

Another type of RF PA that can be used to achieve higher conversion efficiencies at backed-off power levels when high PAPR signals are involved is the Class-G RF PA, a simplified drawing of which is provided in FIG. 12. The Class-G RF PA 1200 comprises a first power transistor (e.g., an n-p-n BJT) 1202 and a second complementary power transistor 1204 (e.g., a p-n-p BJT) connected in a complementary push-pull configuration. The DC bias generators 1206 and 1208 serve to bias the first and second power transistors 1202 and 1204, typically for either Class-B or Class-AB operation. The Class-G RF PA 1200 uses a technique known as "rail switching." As illustrated in FIG. 13, at lower RF output power levels the collectors of the first and second power transistors 1202 and 1204 are configured to receive power supply voltages $V_{CC1}$ and $-V_{CC1}$ but at higher RF output power levels are switched to receive power supply voltages $V_{CC2}$ and $-V_{CC2}$ of higher magnitudes. Although this rail switching approach can help to improve conversion efficiencies at backed-off power levels, the hard switching of the power supplies yields spurious emissions that are very difficult to correct for.

Yet another approach that can be used to improve conversion efficiency when high PAPR signals are involved is a technique known as envelope tracking (ET). As illustrated in FIG. 14, an ET RF PA 1400 employs a dynamic power supply (DPS) 1402 to supply power to an RF PA 1404. The DPS 1402 produces a DPS voltage $V_{DD}(t)$ that tracks the signal envelope 1406 of the incoming RF signal $RF_{IN}$. By powering the RF PA 1404 using the DPS voltage $V_{DD}(t)$, rather than using a constant DC supply voltage $V_{DD}(DC)$, the ET RF PA 1400 is theoretically capable of operating at maximum efficiency over all RF output power levels. Although the ET RF PA 1400 is highly efficient, one significant limitation associated with its use relates to the DPS 1402. In situations where the video bandwidth of the signal envelope 1406 is high, the DPS 1402 has difficulty tracking the signal envelope 1406. The reason for the difficulty is that the power transistors that make up the DPS 1402 have practical constraints that limit their ability to react quickly to rapidly changing signal envelopes, especially in circumstances where the PAPR of the signal envelope is high and the magnitude of the signal envelope approaches zero. When the envelope signal bandwidth exceeds the ability of the power transistors to react, significant amplitude distortion results. This practical constraint limits use of the ET RF PA 1400 to applications in which the signal envelope bandwidth is less than about 20-40 MHz.

Considering the drawbacks and limitations of the prior art RF PA approaches summarized above, it would be desirable to have an RF PA apparatus that operates with high linearity and high-efficiency over a wide range of frequencies, has a wide video bandwidth capability, and is insensitive to changing antenna impedances.

BRIEF SUMMARY OF THE INVENTION

A highly linear, highly efficient wideband radio frequency power amplifier (RF PA) apparatus having wide video bandwidth capability is disclosed. The RF PA apparatus includes a first RF PA, a second RF PA, and a controller. The first RF PA is powered by a first power supply that supplies a first constant DC power supply voltage and is operable to deliver RF power to a load over a first range of RF power levels. The second RF PA is powered by a second power supply that supplies a second DC power supply voltage greater than the first power supply voltage, and is operable to deliver RF power to the load over a second range of RF power levels greater than the first range of RF power levels. The controller serves to control whether the first RF PA is delivering RF power to the load or the second RF PA is delivering RF power to the load, and is further configured to coordinate and control handoffs of RF power delivery between the first and second RF PAs. In one embodiment of the invention the magnitudes of the input RF voltages applied to the RF input ports of the first and second RF PAs are varied to complete handoffs between the first RF PA and the second RF PA. In another embodiment of the invention, the magnitudes of input bias voltages applied to the RF input ports of the first and second RF PAs are varied to complete handoffs between the first and second RF PAs.

The RF PA apparatus of the present invention has a number of significant performance advantages over prior art RF PA approaches. First, it is able to realize conversion efficiencies at backed-off power levels that are comparable to, and in some cases even exceeding, the backed-off conversion efficiencies realized by a conventional Doherty RF PA apparatus. This capability, along with its inherent insensitivity to changing antenna impedances, make the RF PA apparatus of the present invention well-suited for multicarrier applications such as, for example, the carrier aggregation approach contemplated in the Long Term Evolution Advanced (LTE-A) mobile communications standard. Second, it is capable of operating with high back-off conversion efficiencies over a wide range of operating frequencies. Unlike the Doherty RF PA, the RF PA apparatus of the present invention does not rely on the principle of load modulation. Consequently, the tuning bandwidth of the RF PA apparatus of the present invention is not restricted as it is in the Doherty RF PA. Third, not only does the RF PA apparatus of the present invention have a wide operating bandwidth, it also has a wider video bandwidth than can be realized in envelope tracking RF PAs since the RF PA apparatus of the present invention does not employ a dynamic power supply (DPS). Finally, the spurious emissions problem that plagues Class-G RF PAs is completely avoided since the power supply voltages to the first and second RF PAs of the RF PA apparatus remain constant at all times and are not switched. The gradual handoff capability of the RF PA apparatus can also be exploited to reduce the possibility of spurious emission generation during handoff events. Compliance with strict spectral mask requirements is consequently much easier to satisfy than for Class-G RF PAs. The RF PA apparatus of the present invention is therefore an excellent candidate for high-PAPR wideband applications in which high linearity, high conversion efficiency, and wide video bandwidth capability are all desired.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 15:
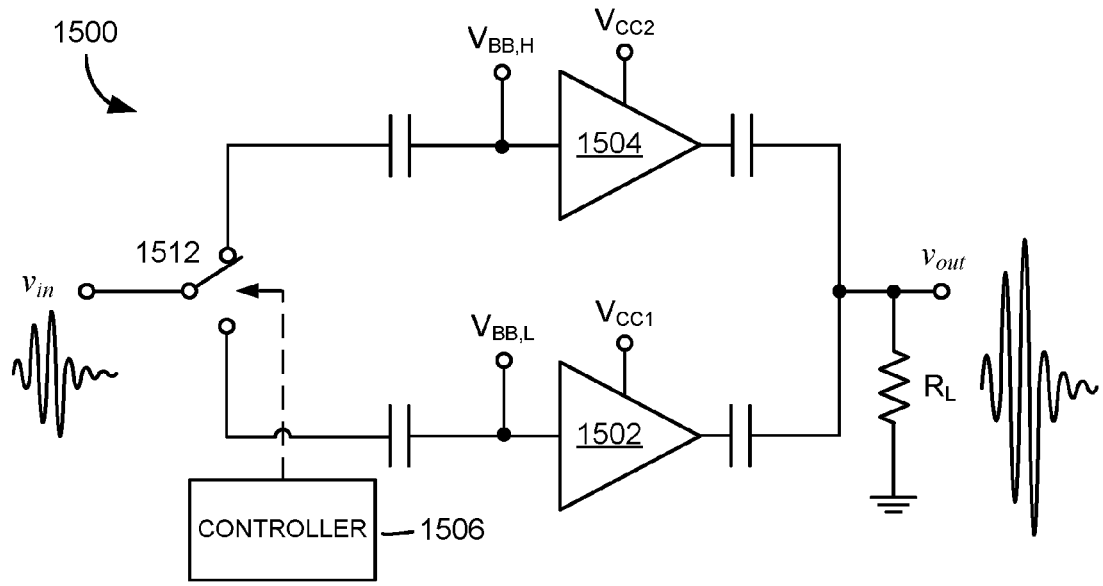
FIG. 15 is a drawing depicting an RF PA apparatus, according to an embodiment of the present invention.

Referring to FIG. 15, there is shown a radio frequency power amplifier (RF PA) apparatus 1500, according to one embodiment of the present invention. The RF PA apparatus 1500 comprises a low-power RF PA 1502, a high-power RF PA 1504, and a controller 1506. The low-power RF PA 1502 and high-power RF PA 1504 may be constructed using either bipolar junction power transistors (BJTs) or field-effect power transistors (FETs). Further, to support high-power, high-frequency applications, any high-power, high-frequency power transistor technology may be used, including, for example, gallium-arsenide (GaAs) metal-semiconductor FETs (MESFETs), gallium-nitride (GaN) high electron mobility transistors (HEMTs), laterally-diffused metal-oxide-semiconductor (LDMOS) transistors, high-breakdown-voltage transistors using silicon-on-insulator (SOI) technology, high-power heterojunction bipolar junction (HBTs), etc. In the detailed description that follows, it is assumed for purposes of illustration that the power transistors used in the RF PA apparatus 1500 (and in other embodiments of the invention) are BJTs, it being understood that FETs could be alternatively used.

The low-power RF PA 1502 has a power supply port that is configured to receive a first constant DC power supply voltage $V_{CC1}$ from a first DC power supply. The high-power RF PA 1504 has a power supply port that is configured to receive a second constant DC power supply voltage $V_{CC2}$ from a second DC power supply. The second constant DC power supply voltage $V_{CC2}$ is greater than the first constant DC power supply voltage $V_{CC1}$, i.e., $V_{CC2} > V_{CC2}$. The greater second constant DC power supply voltage $V_{CC2}$ allows the high-power RF PA 1504 to operate at higher output power levels than the low-power RF PA 1502 can and, consequently, extends the overall dynamic range of output RF powers over which the RF PA apparatus 1500 as a whole operates. In the exemplary RF PA apparatus 1500 described here, the RF input ports of the low-power and high-power RF PAs 1502 and 1504 are biased by fixed DC bias voltages $V_{BB,L}$ and $V_{BB,H}$, respectively. The first and second power supply voltages $V_{CC1}$ and $V_{CC2}$ and input bias voltages $V_{BB,L}$ and $V_{BB,H}$ are set during design so that the low-power and high-power RF PAs 1502 and 1504 may operate according to any desired conduction angle class of RF PA, i.e., as a Class-A, B, AB or C RF PA. In one embodiment of the invention, for example, the low-power RF PA 1502 and high-power 1504 is each biased for Class-A operation when active and delivering RF power to the load $R_L$, thereby maximizing the overall linearity of the RF PA apparatus 1500. In another embodiments the low-power RF PA 1502 and high-power 1504 is each biased for biased for Class-B or Class-AB operation when active and delivering RF power to the load $R_L$, thereby maximizing the overall conversion efficiency of the RF PA apparatus 1500 while still achieving a high level of linearity.

In the exemplary RF PA apparatus 1500 described here, only one of the low-power and high-power RF PAs 1502 and 1504 is delivering RF power to the load $R_L$ at any given time. The low-power RF PA 1502 is responsible for delivering RF power to the load $R_L$ over a first range of output RF power levels, and the high-power RF PA 1504 is responsible for delivering RF power to the load $R_L$ over a second range of output RF power levels higher than the first range of output RF power levels. The controller 1506 controls whether the low-power RF PA 1502 is delivering RF power to the load $R_L$ or the high-power RF PA 1504 is delivering RF power to the load $R_L$ by controlling whether an input RF voltage $v_{in}$ is applied to the RF input port of the low-power RF PA 1502 (i.e., to the low-power "branch" of the RF PA apparatus 1500) or is applied to the RF input port of the high-power RF PA 1504 (i.e., to the high-power branch of the RF PA apparatus 1500), for example, by controlling a switch 1512.

Figure 16:
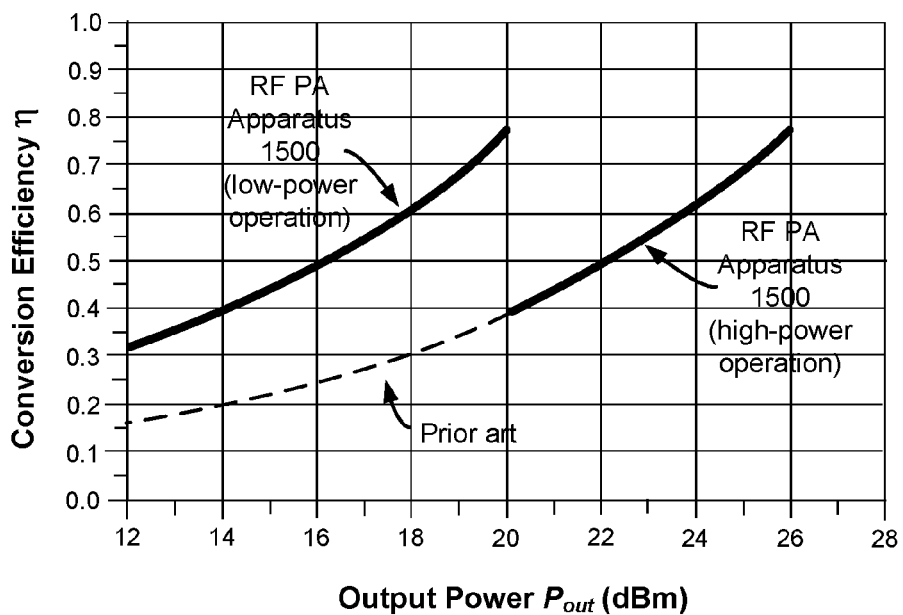
FIG. 16 is a plot of the conversion efficiency η as a function of output power $P_{out}$ of an RF PA apparatus modeled after the RF PA apparatus depicted in FIG. 15.

FIG. 16 is a plot of the conversion efficiency η versus output RF power $P_{out}$ of a simulated RF PA apparatus modeled after the RF PA apparatus 1500 depicted in FIG. 15, for a situation where the low-power RF PA 1502 and high-power RF PA 1504 is each biased for Class-B operation when delivering RF power to the load $R_L$. In the simulation the first power supply voltage $V_{CC1}$ was set to half that of the second power supply voltage $V_{CC2}$, i.e., $V_{CC1}=V_{CC2}/2$. With this 1:2 power supply voltage ratio, the low-power RF PA 1502 serves to deliver RF power to the load $R_L$ over the lower one-fourth of the full dynamic range of output RF power levels over which the RF PA apparatus 1500 as a whole operates, and the high-power RF PA 1504 serves to deliver RF power to the load $R_L$ over the remaining upper three-fourths of the output RF power dynamic range. At backed-off output RF power levels less than 20 dBm only the low-power RF PA 1502 is delivering RF power to the load $R_L$. As shown in FIG. 16, the RF PA apparatus 1500 is able to realize significantly higher conversion efficiencies over the full range of backed-off power levels between 12 and 20 dBm than can be achieved by a single Class-B RF PA apparatus powered by a single power supply and operating over the same dynamic same range of output RF power levels that the RF PA apparatus 1500 as a whole operates. (Compare the conversion efficiencies of the RF PA apparatus 1500 in FIG. 16 in the range of backed-off power levels between 12 and 20 dBm to the much lower conversion efficiencies realized by the prior art Class-B RF PA apparatus (dashed line) in the same range of output RF power levels.) Since the high-power RF PA 1504 is available to extend the dynamic range of output RF power levels over the remaining upper three-fourths of the dynamic range, and in this example the power supply voltage $V_{CC1}$ is one-half of $V_{CC2}$, the low-power RF PA 1502 is able to achieve maximum conversion efficiency ($\eta=\pi/4$) at one-fourth the peak output power (PEP) of the RF PA apparatus 1500 taken as a whole. This capability allows the RF PA apparatus 1500 to operate with significantly higher conversion efficiencies over the full range of backed-off power levels (between 12 to 20 dBm in this example) than is possible in the conventional Class-B RF PA.

For output RF power levels $P_{out}$ above 20 dBm in FIG. 16, power delivery to the load $R_L$ is performed by the high-power RF PA 1504. Since the high-power RF PA 1504 is only responsible for delivering RF power to the load $R_L$ over the upper three-fourths of the full dynamic range of output RF powers over which the RF PA apparatus 1500 as a whole operates, the high-power RF PA 1504 is also able to operate with high conversion efficiencies over the full range of output RF power levels that it operates. By restricting the range of output RF power levels over which the high-power RF PA 1504 operates, the high-power RF PA 1504 operates, on average, closer to PEP (where its efficiency is highest) compared to if it was required to operate over the full dynamic range of output RF power levels that the RF PA apparatus 1500 as a whole operates.

Figure 17:
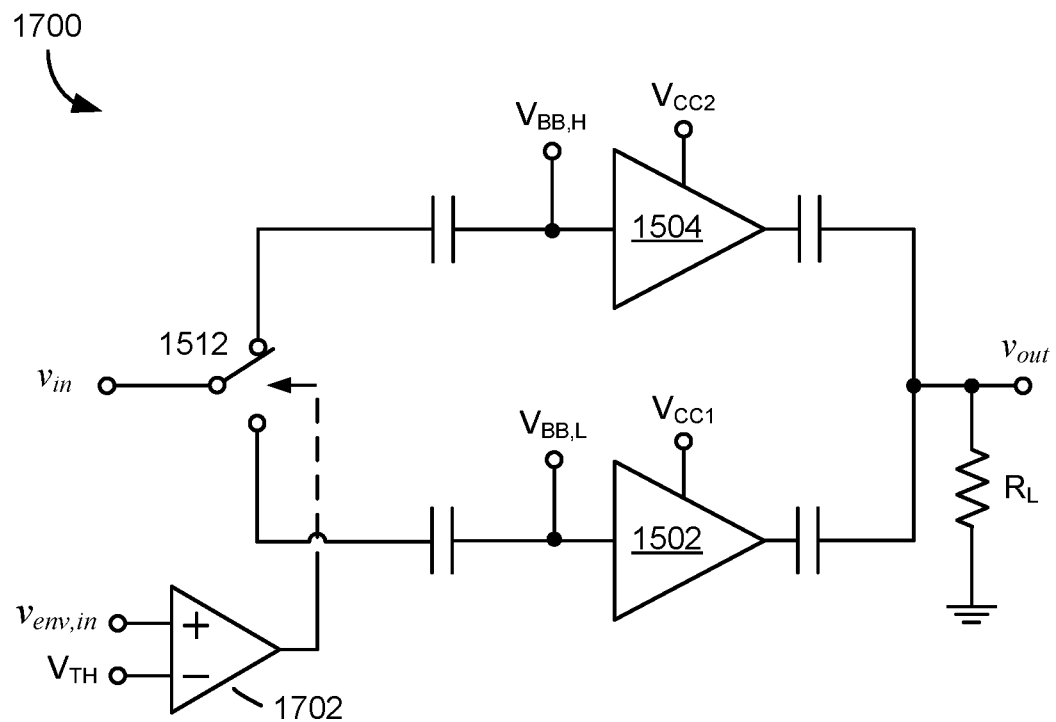
FIG. 17 is a drawing depicting an RF PA apparatus, according to an embodiment of the present invention.

The event or condition that causes the controller 1506 in the RF PA apparatus 1500 to redirect the input RF voltage $v_{in}$ from the RF input port of the low-power RF PA 1502 (i.e., from the low-power branch of the RF PA apparatus 1500) to the RF input port of the high-power RF PA 1504 (i.e., to the high-power branch), and vice versa, can be based on any input or output condition or on any external triggering stimulus independent of the operation of the RF PA apparatus 1500. The controller 1506 can also be implemented using analog, digital, or a combination of analog and digital circuits. In accordance with one embodiment of the invention, illustrated in FIG. 17, an analog device (in this example, an analog comparator 1702) is used. The comparator 1702 is configured to continuously compare the magnitude of the time-varying input signal envelope voltage $v_{env,in}$ to some fixed, predetermined threshold voltage $V_{TH}$. During times when $V_{env,in}<V_{TH}$, the comparator 1702 produces an output that causes the switch 1512 to direct the input RF voltage $v_{in}$ to the low-power branch of the RF PA apparatus 1700. However, upon detecting that the magnitude of the input signal envelope voltage $v_{env,in}$ has risen to a value that exceeds the threshold voltage $V_{TH}$, i.e., upon $V_{env,in}>V_{TH}$, the comparator 1702 changes state, causing the switch 1512 to redirect the input RF voltage $v_{in}$ from the low-power branch to the high-power branch. Upon the comparator 1702 detecting that the magnitude of the input signal envelope voltage $v_{env,in}$ has subsequently fallen to a value lower than the threshold voltage $V_{TH}$, i.e., upon $V_{env,in}<V_{TH}$, the comparator 1702 once again changes state, causing the switch 1512 to also change state and redirect the input RF voltage $v_{in}$ back to the low-power branch.

Figure 18:
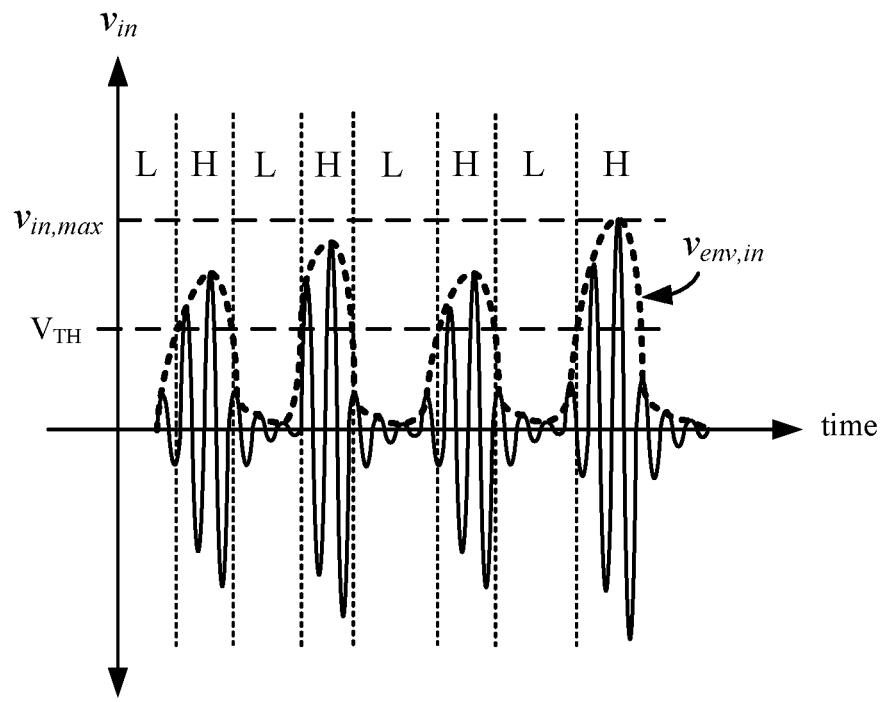
FIG. 18 is a signal diagram that illustrates the difference and relationship between the input RF voltage $v_{in}$ applied to the RF PA apparatus in FIG. 17 and the signal envelope $v_{env,in}$ of the RF input voltage $v_{in}$.

It should be emphasized that the signal envelope voltage $v_{env,in}$ of the input RF voltage $v_{in}$ is not the magnitude of the input RF voltage $v_{in}$ itself. The relationship and difference between the signal envelope voltage $v_{env,in}$ and the input RF voltage $v_{in}$ itself can be better understood by referring to the signal diagram presented in FIG. 18. There it can be seen that the input signal envelope voltage $v_{env,in}$ varies much more slowly over time than does the input RF voltage $v_{in}$ itself. Although it is conceivable that the magnitude of the input RF voltage $v_{in}$ could be used as the basis for controlling whether the input RF voltage $v_{in}$ is directed to the low-power branch or the high-power branch, such a control mechanism would be difficult to implement at GHz frequencies. Accordingly, in the exemplary embodiment of the invention described here, the more slowly varying signal envelope voltage $v_{env,in}$ is used. (Note that the time spans labeled "L" in FIG. 18 are indicative of times during which the low-power branch is selected and the low-power RF PA 1502 is delivering RF power to the load $R_L$, and the time spans labeled "H" are indicative of times during which the high-power branch is selected and the high-power RF PA 1504 is delivering RF power to the load $R_L$.)

Figure 1:
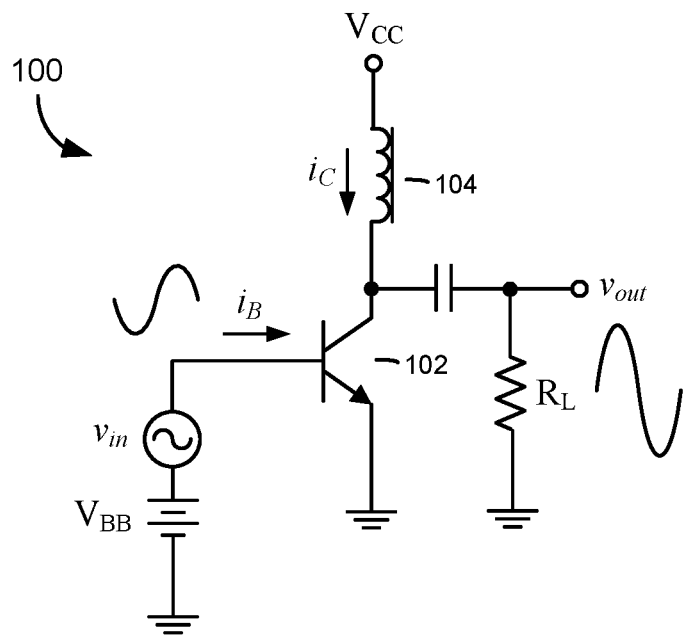
FIG. 1 is a schematic drawing of a conventional radio frequency power amplifier (RF PA) configured for Class-A operation.
Figure 2:
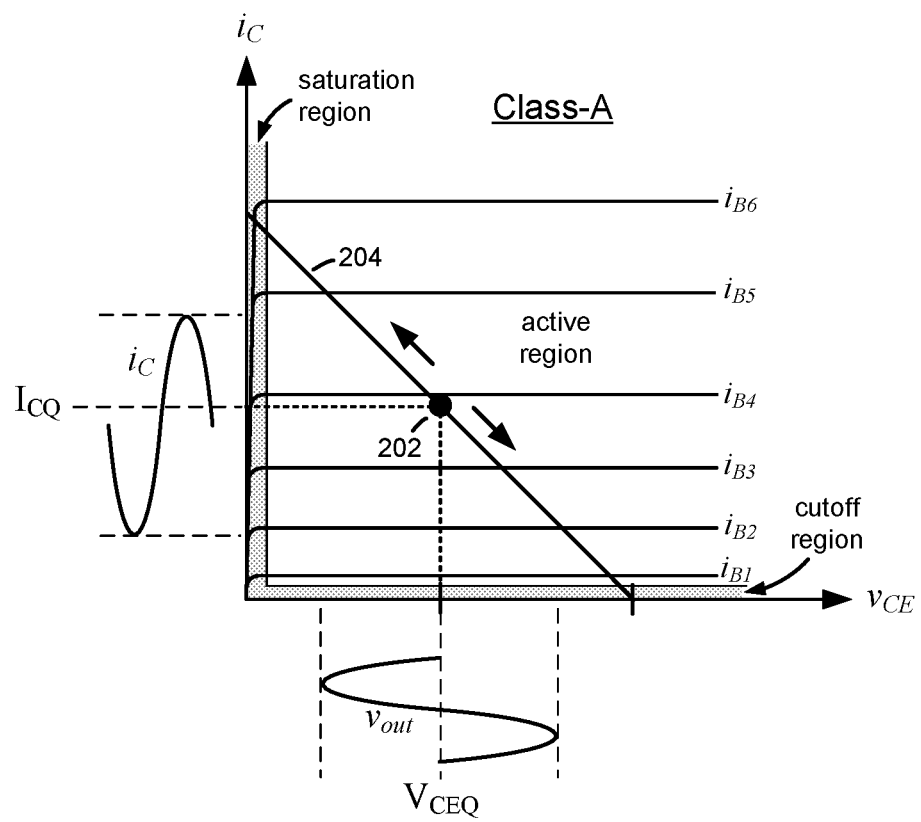
FIG. 2 is a drawing of the current versus voltage (I-V) characteristics of the power transistor of the RF PA depicted in FIG. 1, showing the operating point and load line of the RF PA when configured for Class-A operation.
Figure 3:
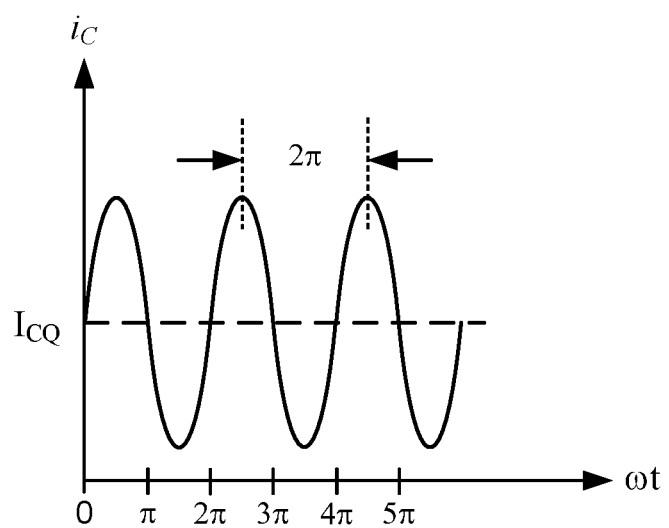
FIG. 3 is a signal diagram of the collector current produced by the conventional RF PA depicted in FIG. 1, when configured for Class-A operation.
Figure 4:
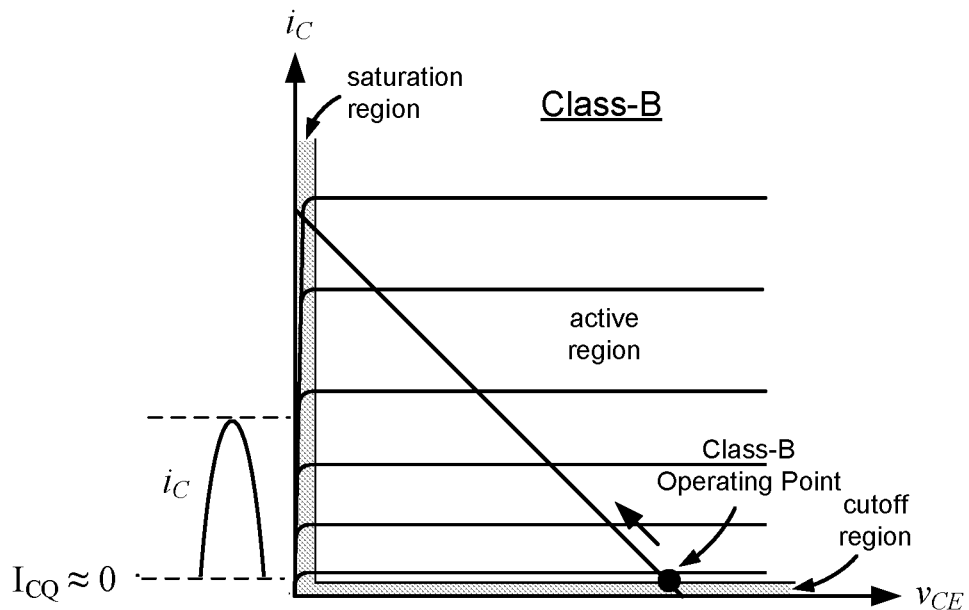
FIG. 4 is a drawing of the I-V characteristics of a power transistor and the operating point and load line of an RF PA constructed from the power transistor, for the situation where the RF PA is configured for Class-B operation.
Figure 5:
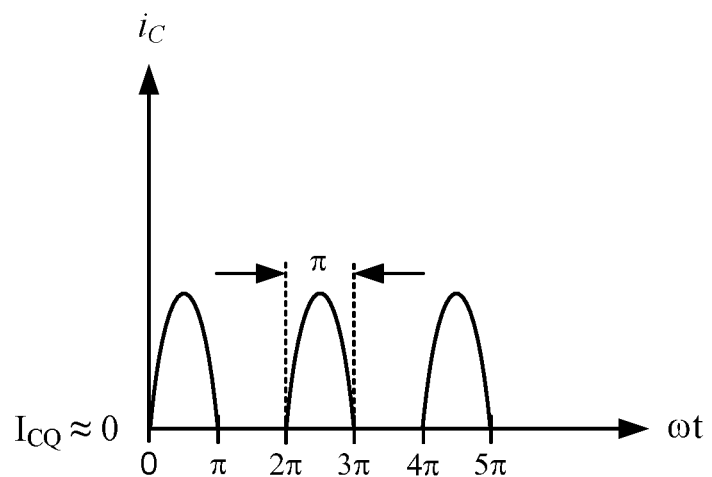
FIG. 5 is a signal diagram of the collector current produced by an RF PA when configured for Class-B operation.
Figure 6:
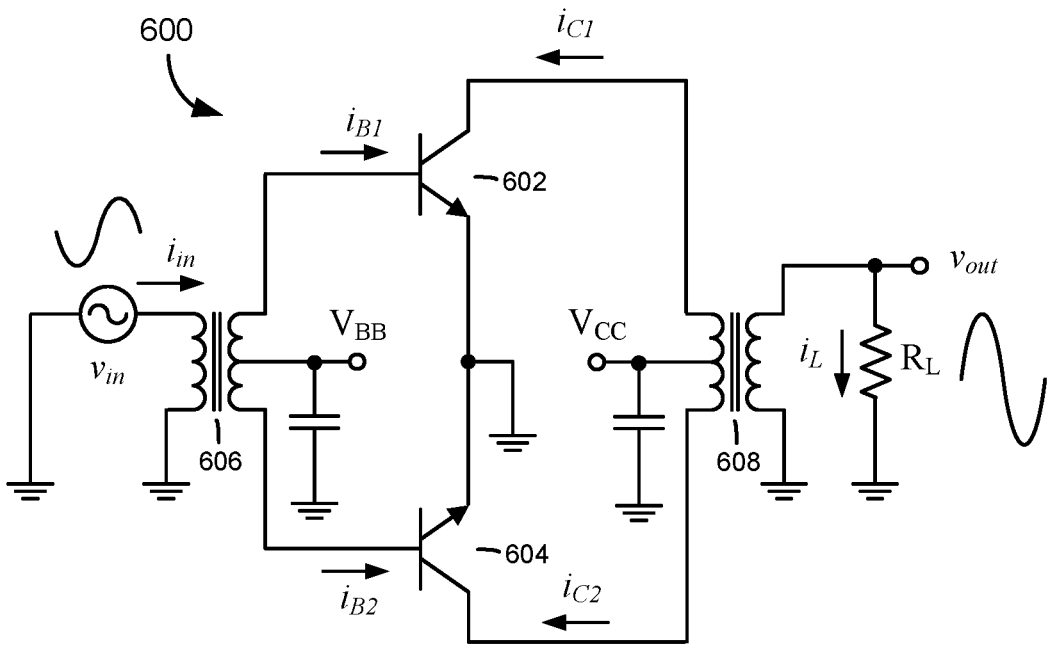
FIG. 6 is a schematic drawing of a conventional push-pull RF PA configured for Class-B operation.
Figure 7:
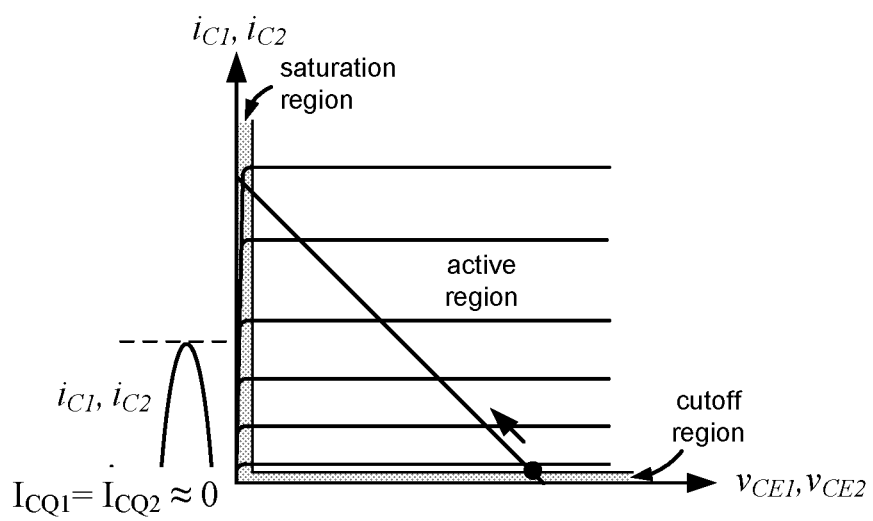
FIG. 7 is a drawing of the I-V characteristics of the power transistors used in the conventional push-pull RF PA depicted in FIG. 6, highlighting that the quiescent currents $I_{CQ1}$ and $I_{CQ2}$ are approximately zero when the push-pull RF PA is configured for Class-B operation.
Figure 8:
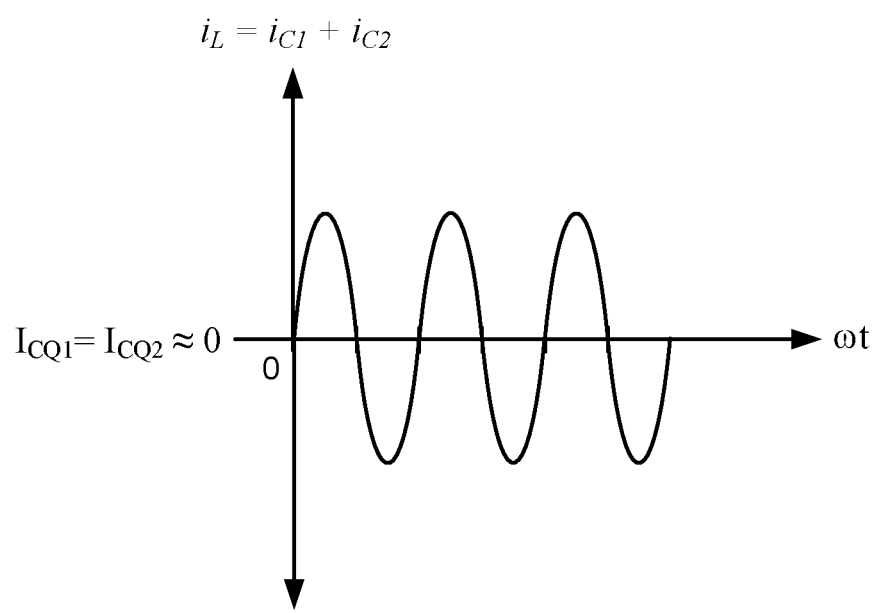
FIG. 8 is a signal diagram of the load current $i_L$ produced by the push-pull RF PA depicted in FIG. 6, when the push-pull RF PA is configured for Class-B operation.
Figure 9:
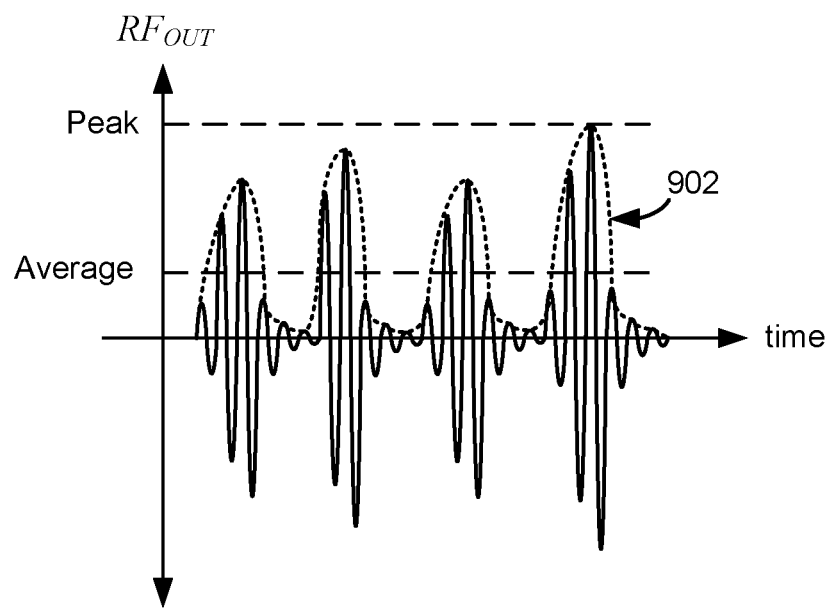
FIG. 9 is a signal diagram of an RF waveform having a high peak-to-average power ratio (PAPR)
Figure 10:
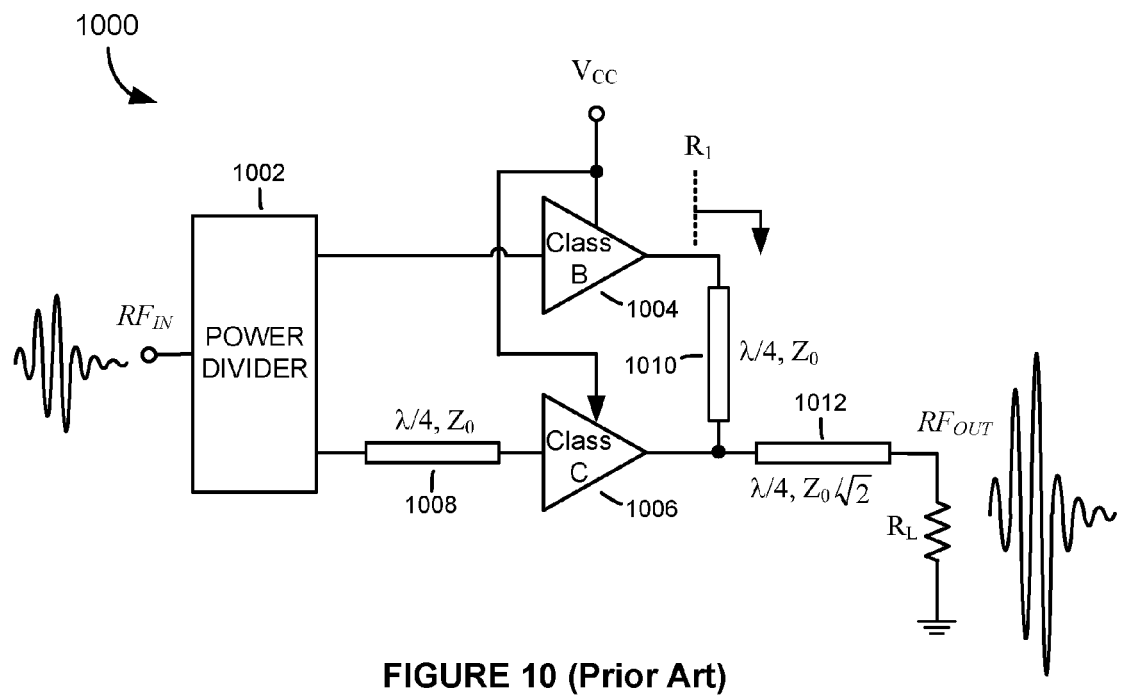
FIG. 10 is a drawing of a conventional Doherty RF PA apparatus.
Figure 11:
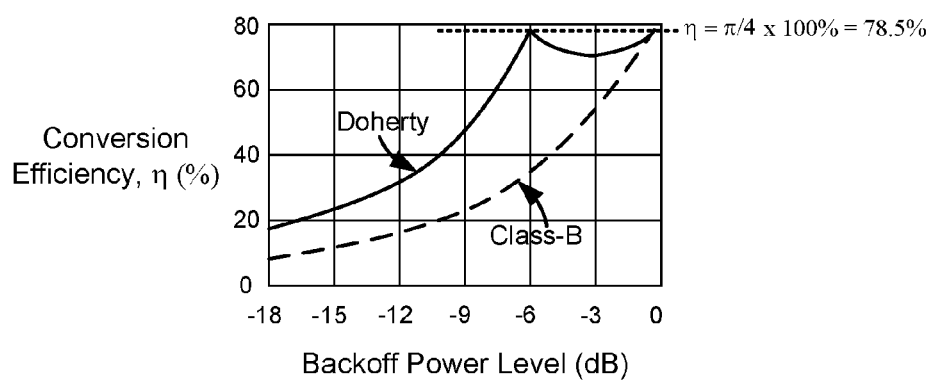
FIG. 11 is a plot contrasting the conversion efficiency of the Doherty RF PA apparatus depicted in FIG. 10 to the conversion efficiency of a conventional Class-B RF PA.
Figure 12:
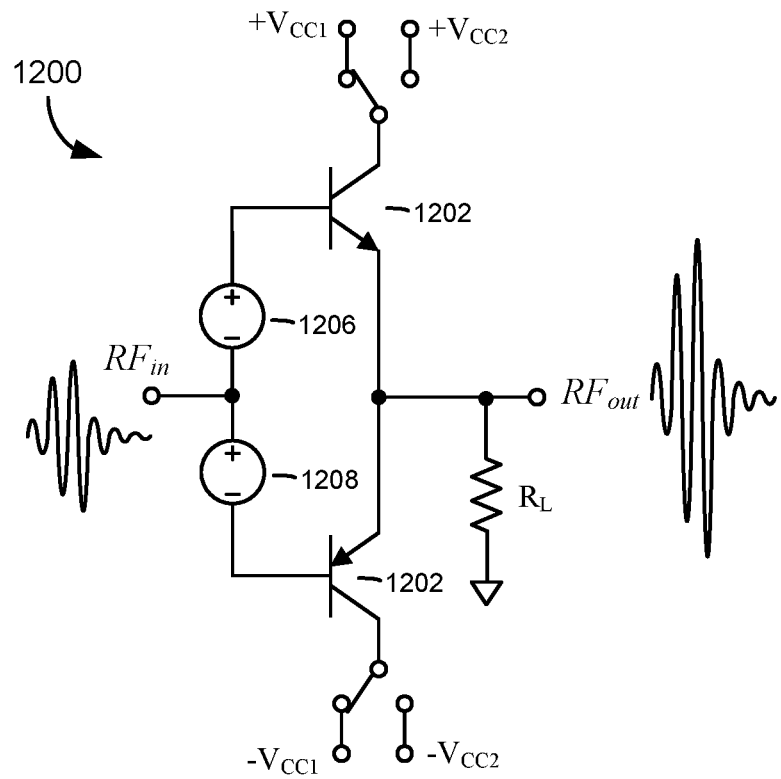
FIG. 12 is a schematic drawing of a conventional Class-G RF PA.
Figure 13:
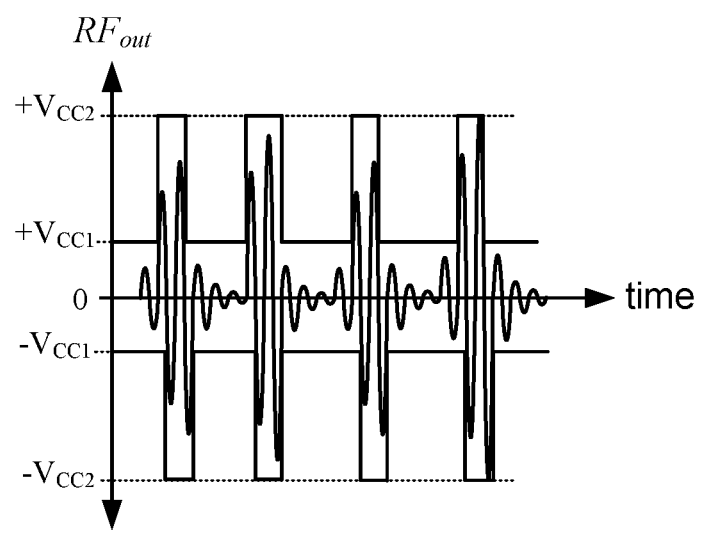
FIG. 13 is a signal diagram of the RF output signal produced by the Class-G RF PA depicted in FIG. 12, illustrating the hard switching property of the Class-G RF PA.
Figure 14:
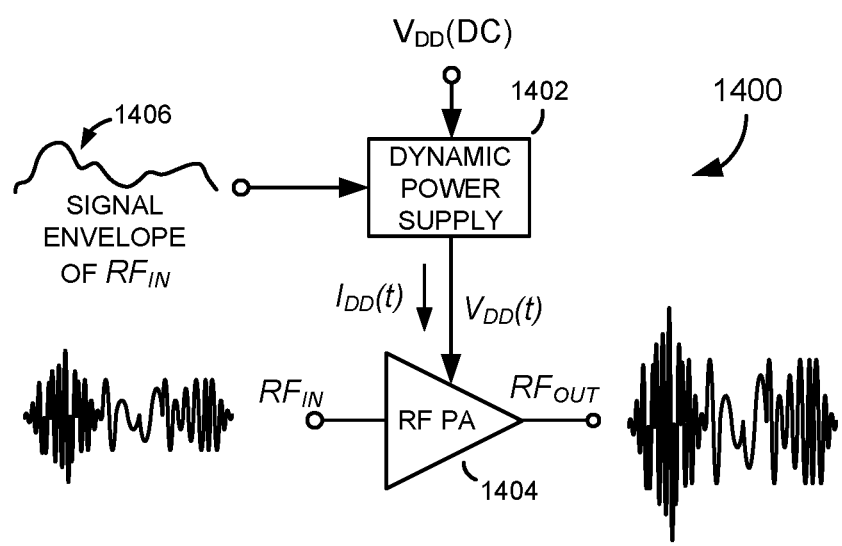
FIG. 14 is a drawing depicting a conventional envelope tracking (ET) RF PA, highlighting its use of a dynamic power supply (DPS)

The input signal envelope voltage $v_{env,in}$ can be extracted from the input RF voltage $v_{in}$ using well-known circuit techniques, for example, by using a envelope detector. Alternatively, it can be provided by a digital baseband processors (DSP) (and converted to an analog signal, if necessary). Many state-of-the-art DSPs designed for modern RF transmitters will typically provide an envelope-following output signal, which can be used to control the dynamic power supply (DPS) employed in envelope-tracking (ET) RF PAs (such as in the ET RF PA 1400 described above in reference to FIG. 14) and polar transmitters. Although the RF PA apparatus 1700 does not employ a DPS, the envelope-following signal produced by such a DSP could be exploited for use as the input signal envelope voltage $v_{env,in}$ for the comparator 1702, or could be exploited to generate the necessary input signal envelope voltage $v_{env,in}$ required of the comparator 1702.

Figure 19:
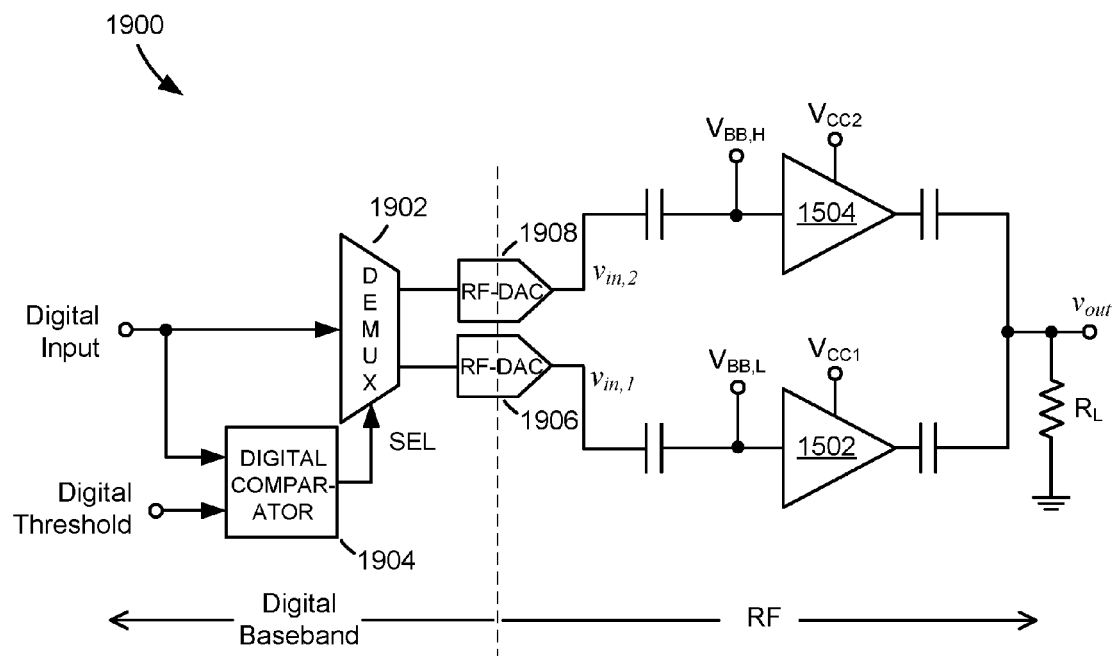
FIG. 19 is a drawing depicting an RF PA apparatus, according to an embodiment of the present invention.

FIG. 19 is a drawing depicting an RF PA apparatus 1900 according to another embodiment of the invention. In this RF PA apparatus 1900 an input digital baseband signal is selectively switched between first and second RF digital-to-analog converters (RF-DACs) 1906 and 1908 configured in the low-power and high-power branches of the RF PA apparatus 1900, respectively. The switching is performed using digital baseband circuitry, in this example, by a digital comparator 1902 and digital demultiplexer 1904. So long as the digital comparator 1904 determines that the samples in the input digital baseband signal have values less than some predetermined digital threshold, the digital comparator 1902 causes the demultiplexer 1904 to direct the input digital baseband signal to the input of the first RF-DAC 1906. On the other hand, if the digital comparator 1904 determines that samples of the input digital baseband signal have values greater than the digital threshold, the digital comparator 1902 causes the demultiplexer 1904 to direct the input digital baseband signal to the input of the second RF-DAC 1908.

The first and second RF-DACs 1906 and 1908 perform two primary functions. First, each converts the digital signal being applied to its input into an analog signal. Second, each upconverts the analog signal to RF. Accordingly, when the digital comparator 1902 and digital demultiplexer 1904 have switched the input digital baseband signal to the input of the first RF-DAC 1906, the first RF-DAC 1906 responds by producing a first input RF voltage $v_{in,1}$ at its output. With the first input RF voltage $v_{in,1}$ applied to the RF input port of the low-power RF PA 1502, the low-power RF PA 1502 is then able to deliver RF power to the load $R_L$. On the other hand, when the digital comparator 1902 and digital demultiplexer 1904 have switched the input digital baseband signal to the input of the second RF-DAC 1908, the second RF-DAC 1908 responds by producing a second input RF voltage $v_{in,2}$ at its output. With the second input RF voltage $v_{in,2}$ applied to the RF input port of the high-power RF PA 1504, the high-power RF PA 1504 is then able to deliver RF power to the load $R_L$.

Figure 20:
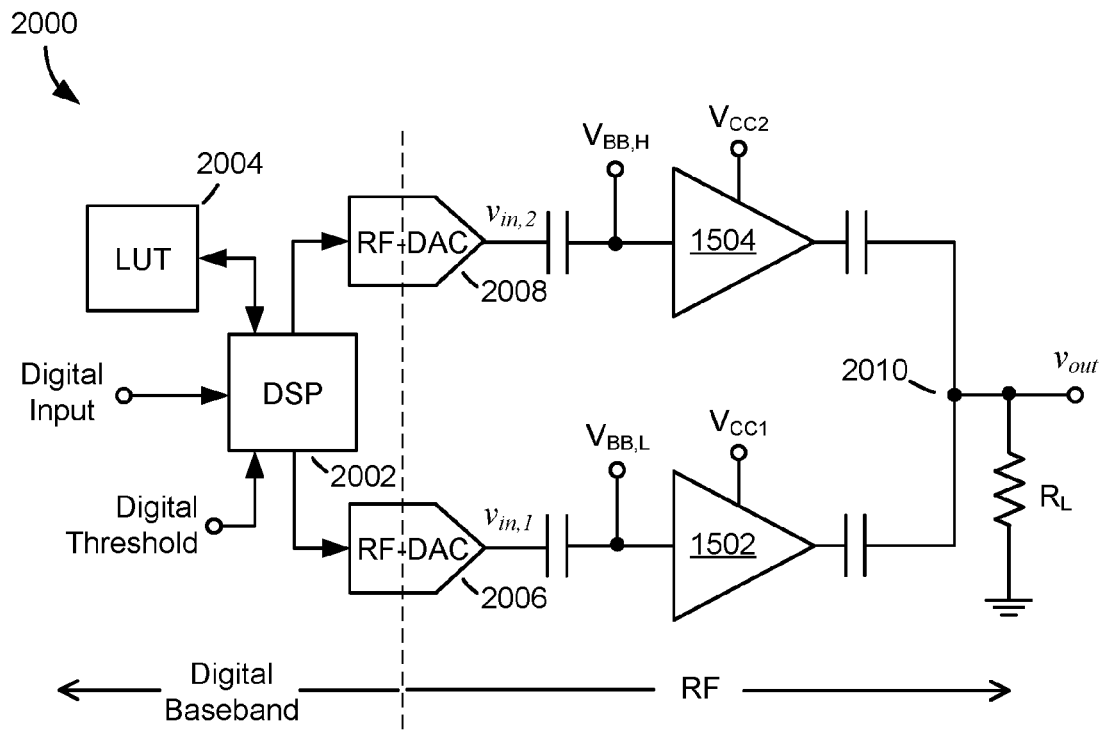
FIG. 20 is a drawing depicting an RF PA apparatus, according to an embodiment of the present invention.

In the exemplary RF PA apparatuses described above the transition between low-power operation (low-power RF PA delivering RF power to the load $R_L$) and high-power operation (high-power RF PA delivering RF power to the load $R_L$) is performed by switching between the low-power and high-power branches. While such approaches can be satisfactory in some applications, in others a more gradual transition or ("handoff") between the two branches is preferred, as a more gradual handoff can better facilitate linear operation during the handoff and can reduce the possibility of transient events from arising during the handoff. FIG. 20 is a drawing depicting an RF PA apparatus 2000 that provides this gradual handoff capability, in accordance with another embodiment of the present invention. Similar to the RF PA apparatus 1900 described above in reference to FIG. 19, handoff between the low-power and high-power RF PAs 1502 and 1504 is performed at baseband using digital techniques. However, rather than switching the input digital baseband signals between the low-power and high-power branches, a digital signal processor DSP 2002 and lookup table (LUT) 2004 are used to coordinate a gradual handoff between the two branches. The LUT 2004 is formed in an electronic memory that is configured to store a plurality of digital transition parameters. The plurality of digital transition parameters are accessed and retrieved by the DSP 2002 during handoffs between the low-power and high-power branches of the RF PA apparatus 2000. As with other embodiments of the invention, the event or condition that triggers a handoff from one branch to the other can be based on any input or output condition or on any external triggering stimulus independent of the operation of the RF PA apparatus 2000. In the exemplary RF PA apparatus 2000 described here, a handoff is initiated whenever the digital value of an input digital baseband signals rises above or falls below some predetermined digital threshold. Upon the input digital baseband signal rising to a value that exceeds the predetermined digital threshold, the DSP 2002 begins retrieving first and second sequences of digital transition parameters from the LUT 2004. Using the first sequence of retrieved digital transition parameters, the DSP 2002 gradually reduces the values of the digital samples being applied to a first RF-DAC 2006. During the same time that the DSP 2002 is retrieving the first sequence of digital transition parameters from the LUT 2004 to gradually reduce the values of the digital samples being applied to a first RF-DAC 2006, the DSP 2002 is also retrieving the second sequence of digital transition parameters from the LUT 2004 to gradually increase the values of the digital samples being applied to a second RF-DAC 2008. In this manner the first RF-DAC 2006 gradually reduces the magnitude of the RF voltage $v_{in,1}$ it produces for the low-power branch of the RF PA apparatus 2000 and the second RF-DAC 2008 gradually increases the magnitude of the RF voltages $v_{in,2}$ it produces for the high-power branch. The handoff from the low-power RF PA 1502 to the high-power RF PA 1504 is completed once the magnitude of the first input RF voltages $v_{in,1}$ has been reduced to zero (which effectively disables the low-power RF PA 1502) and the second input RF voltage $v_{in,2}$ has risen to a value that allows the high-power RF PA 1504 to take over full responsibility for delivering RF power delivery to the load $R_L$. A gradual handoff from the high-power RF PA 1504 back to the low-power RF PA is initiated upon the DSP 2002 determining that the input digital baseband signal has subsequently lowered to a value less than the digital threshold. The handoff from the high-power RF PA 1504 back to the low-power RF PA 1502 is performed opposite to that described above, with the DSP 2002 retrieving digital transition parameters from the LUT 2004 that cause the magnitude of the second input RF voltages $v_{in,2}$ to gradually lower to a value that effectively turns the high-power RF PA 1504 off and the first input RF voltage $v_{in,1}$ to gradually increase to a level that allows low-power RF PA 1502 takes over responsibility for delivering RF power to the load $R_L$.

Figure 21:
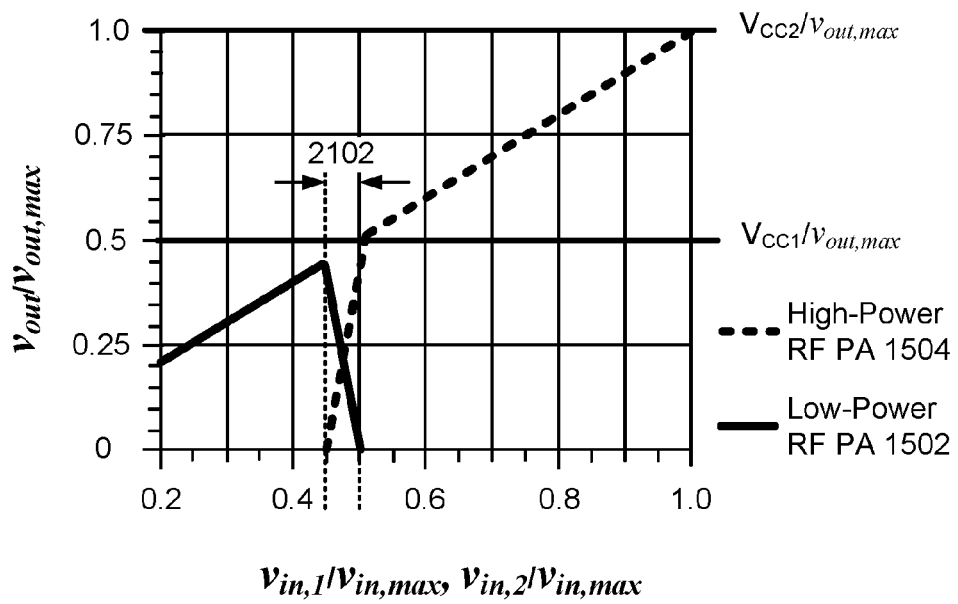
FIG. 21 is a plot showing the individual output voltage versus input voltage characteristics of the low-power and high-power RF PAs of an RF PA apparatus modeled after the RF PA apparatus depicted in FIG. 20.
Figure 22:
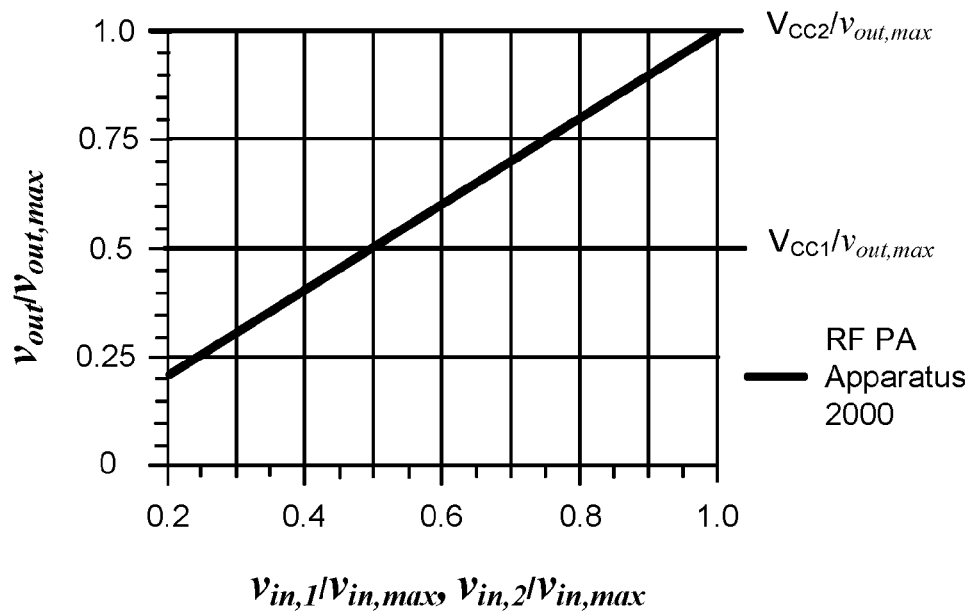
FIG. 22 is a plot of the combined output voltage $v_{out}$ versus input voltage $v_{in}$ characteristics of an RF PA apparatus modeled after the RF PA apparatus depicted in FIG. 20.

FIG. 21 is a plot showing the individual output voltage versus input voltage characteristics of the low-power and high-power RF PAs 1502 and 1504 of a simulated RF PA apparatus modeled after the RF PA apparatus 2000 depicted in FIG. 20. The solid curve in the plot is the output voltage versus input voltage characteristics of the low-power RF PA 1502, and the dashed curve in the plot is the output voltage versus input voltage characteristics of the high-power RF PA 1504. FIG. 22 is plot showing the combined output voltage $v_{out}$ versus input voltage $v_{in}$ characteristics obtained from the simulation. This plot shows that the interpolating effect that occurs between the low-power RF PA 1502 and high-power RF PA 1504 during a handoff event results in the two output voltages of the low-power and high-power RF PAs 1502 and 1504 effectively being summed at the common output node 2010 of the RF PA apparatus 2000, resulting in a response that is substantially linear through the handoff region 2102 in FIG. 21. The combined output voltage characteristics in FIG. 22 further reveals that the response of the RF PA apparatus 2000 is also highly linear for all values of the applied input RF voltages $v_{in,1}$ and $v_{in,2}$ outside the handoff region 2102.

Figure 23:
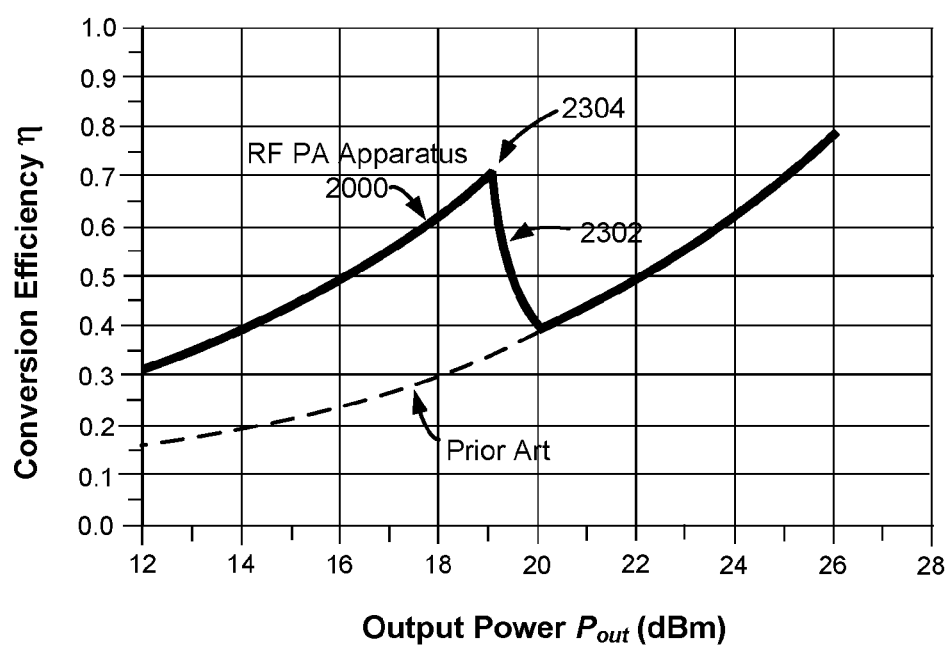
FIG. 23 is a plot of the conversion efficiency η as a function of output power $P_{out}$ of an RF PA apparatus modeled after the RF PA apparatus depicted in FIG. 20.

In addition to operating with high linearity, the RF PA apparatus 2000 also operates with high conversion efficiency over its full dynamic range of output RF power levels. FIG. 23 is a plot of the conversion efficiency η of a simulated RF PA apparatus modeled after the RF PA apparatus 2000 as a function of output power $P_{out}$, for a situation where the low-power RF PA 1502 and high-power RF PA 1504 was each biased for Class-B operation when active and delivering power to the load. The conversion efficiency profile of the RF PA apparatus 2000 is seen to be similar to the conversion efficiency profile of the RF PA apparatus 1500 described above (see FIG. 16), except for the conversion efficiency transition 2304 that is present between 19 and 20 dBm and except for the somewhat lower maximum conversion efficiency 2304 that is achieved at backed-off power levels. The conversion efficiency transition 2302 is present, and the somewhat lower maximum conversion efficiency 2304 results, due to the gradual handoff that is performed by the RF PA apparatus 2000. Although the η≈70% maximum conversion efficiency of the RF PA apparatus 2000 at backed-off power levels is somewhat lower than the η=π/4=78.5% maximum conversion efficiency realized by the RF PA apparatus 1500 at backed-off power levels (compare FIG. 23 to FIG. 16), the RF PA apparatus 2000 has the advantage of being capable of performing handoffs between the low-power and high-power branches gradually. As explained above, this gradual handoff capability is desirable since it facilitates a smooth and linear response during the handoff and eliminates, or at least substantially reduces the possibility of, transient events being generated during the handoff. Data gathered from simulations performed on RF PA apparatuses modeled after the RF PA apparatuses 1500 and 2000 further reveals that the maximum conversion efficiency at backed-off power levels is highest when the handoff time is minimized but the ability to eliminate transients is enhanced when the handoff time is made more gradual. Taking these competing interests into consideration, the rate at which the handoff is performed can be set during design to realize the best or desired combination of handoff 'smoothness' and maximum backed-off power efficiency. It should be emphasized that even with the somewhat reduced maximum conversion efficiency 2304 at backed-off power levels, the conversion efficiency of the RF PA apparatus 2000 over the entire range of backed-off power levels (i.e., between about 12 dBm and 19 dBm) is still substantially higher than can be realized by a single prior art Class-B RF PA using a single power supply and operating over the same dynamic range of output RF power levels that the RF PA apparatus 2000 as a whole operates.

Figure 24:
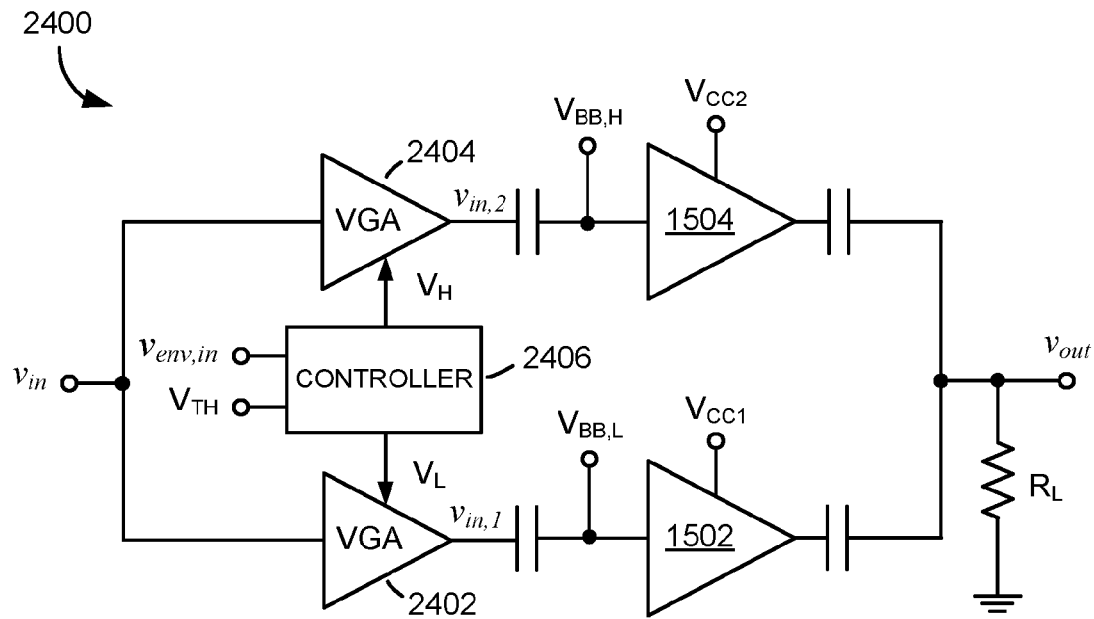
FIG. 24 is a drawing depicting an RF PA apparatus, according to an embodiment of the present invention.

In the exemplary RF PA apparatus 2000 described above, during a handoff event the magnitudes of first and second input RF voltages $v_{in,1}$ and $v_{in,2}$ are controlled at baseband by manipulating the values of digital samples applied to first and second RF-DACs 2006 and 2008. FIG. 24 is a drawing depicting an RF PA apparatus 2400 according to another embodiment of the invention, in which first and second variable gain amplifiers (VGAs) 2402 and 2404 are used to vary the magnitudes of the first and second input RF voltages $v_{in,1}$ and $v_{in,2}$ during handoff events. Similar to the RF PA apparatus 2000 depicted in FIG. 20, the RF PA apparatus 2400 depicted in FIG. 24 includes a low-power RF PA 1502 configured to receive a first constant DC power supply voltage $V_{CC1}$, and a high-power RF PA 1504 configured to receive a second constant DC power supply voltage $V_{CC2}$ greater than the first DC power supply voltage (i.e., $V_{CC2} > V_{CC1}$). Also similar to the RF PA apparatus 2000, the RF input ports of the low-power and high-power RF PAs 1502 and 1504 of the RF PA apparatus 2400 are biased by fixed DC bias voltages $V_{BB,L}$ and $V_{BB,H}$. However, rather than controlling the magnitudes of the first and second input RF voltages $v_{in,1}$ and $v_{in,2}$ by manipulating the values of digital samples applied to the first and second RF-DACs 1806 and 1808 during a handoff event, the first and second VGAs 2402 and 2404 are used to gradually adjust the magnitudes of the first and second input RF voltages $v_{in,1}$ and $v_{in,2}$.

Figure 25:
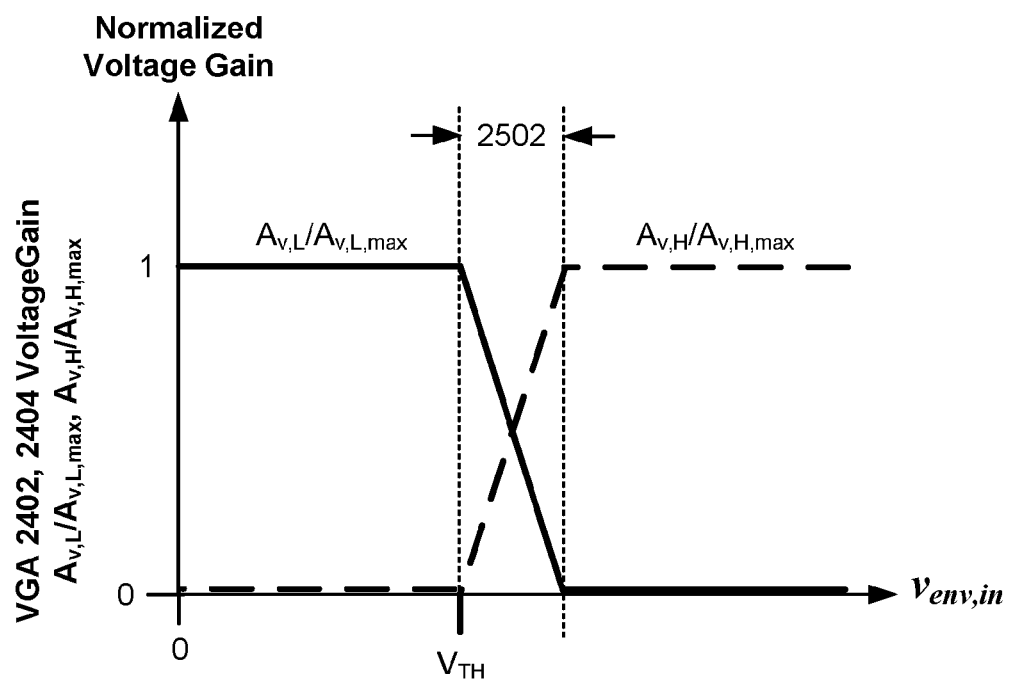
FIG. 25 is a diagram illustrating how the voltage gains $A_{V,L}$ and $A_{V,H}$ of the first and second VGAs in the RF PA apparatus depicted in FIG. 24 can be adjusted during a handoff event.

FIG. 25 is a diagram illustrating how the controller 2406 of the RF PA apparatus 2400 gradually adjusts the voltage gains $A_{V,L}$ and $A_{V,H}$ of the first and second VGAs 1902 and 1904 during a handoff event 2502, in order to effect a gradual handoff in power delivery from the low-power RF PA 1502 to the high-power RF PA 1504. Similar to the controller 1702 in the RF PA apparatus 1700 described above (see FIG. 17), the controller 2406 in the RF PA apparatus 2400 is configured to respond to the magnitude of the signal envelope voltage $v_{env,in}$ of the incoming input RF voltage $v_{in}$. However, during the handoff event 2502 (see FIG. 25), rather than generating a control output that toggles the ON/OFF status of a switch 1512 (as the controller 1702 in the RF PA apparatus 1700 does), the controller 2406 of the RF PA apparatus 2400 generates gain control voltages $V_L$ and $V_H$, which are gradually adjusted during the handoff event 2502 in accordance with the time-varying magnitude of the input signal envelope voltage $v_{env,in}$. For magnitudes of the signal envelope voltage $v_{env,in}$ that are less than the threshold voltage $V_{TH}$, the controller 2406 maintains the gain control voltage $V_L$ at a value that causes the first VGA 2402 to set and maintain its voltage gain $A_{v,L}$ at its maximum gain (i.e., so that $A_{v,L}=A_{v,L,max}$), and maintains the gain control voltage $V_H$ at a value that causes the second VGA 2404 to set and maintain its voltage gain $A_{v,H}$ at its minimum gain (i.e., so that $A_{v,H}=0$). With $A_{v,L}=A_{v,L,max}$ and $A_{v,H}=0$, the input RF voltage $v_{in,1}$ is therefore applied to the RF input port of the low-power RF PA 1502 and the high-power RF PA 1504 is essentially disabled. Accordingly, during times when the magnitude of the input signal envelope voltage $v_{env,in}$ is less than the threshold voltage $V_{TH}$, responsibility for delivering RF power to the load $R_L$ remains entirely with the low-power RF PA 1502. The controller 2406 maintains the settings of the gain control voltages $V_L$ and $V_H$ it produces until it determines that the magnitude of the signal envelope voltage $v_{env,in}$ has risen to a value that exceeds the threshold voltage $V_{TH}$. Upon that condition occurring, the controller 2406 responds by gradually lowering the gain control voltage $V_L$ it is producing and applying to the gain control input of the first VGA 2402, resulting in the voltage gain $A_{v,L}$ of the first VGA 2402 gradually reducing from its maximum gain value to its minimum gain value. During the same time, the controller 2406 gradually increases the gain control voltage $V_H$ it produces and is applying to the gain control input of the second VGA 2404, resulting in the voltage gain $A_{v,H}$ of the second VGA 2404 gradually increasing from its minimum gain value to its maximum gain value. This gradual reduction of the voltage gain $A_{v,L}$ of the first VGA 2402 results in the input RF voltage $v_{in,1}$ eventually reducing to zero, effectively disabling the low-power branch. The simultaneous gradual increase of the voltage gain $A_{v,H}$ of the second VGA 2404 results in raises the magnitude of the input RF voltage $v_{in,2}$ being applied to the RF input port of the high-power RF PA 1504, thus allowing the high-power RF PA 1504 to take over responsibility for delivering RF power to the load $R_L$. The gradual reduction of the voltage gain $A_{v,L}$ of the first VGA 2402 and simultaneous gradual increase of the voltage gain $A_{v,H}$ of the second VGA 2404 therefore effectively results in the desired gradual handoff in responsibility for delivering RF power to the load $R_L$ from the low-power RF PA 1502 to the high-power RF PA 1504. Once the handoff from the low-power branch to the high-power branch has completed, the controller 2406 maintains the gain control voltages $V_L$ and $V_H$ it is then applying to the gain control inputs of the first and second VGAs 2402 and 2404, until the magnitude of the signal envelope voltage $V_{env,in}$ subsequently falls to a value less than the threshold voltage $V_{TH}$. Upon that condition occurring, the controller 2406 then adjusts the gain control voltages $V_L$ and $V_H$ it is producing and applying to the gain control inputs of the first and second VGAs 2402 and 2404 in the reverse order from that described above, in order to coordinate a gradual and smooth handoff from the high-power RF PA 1504 back to the low-power RF PA 1502.

Figure 26:
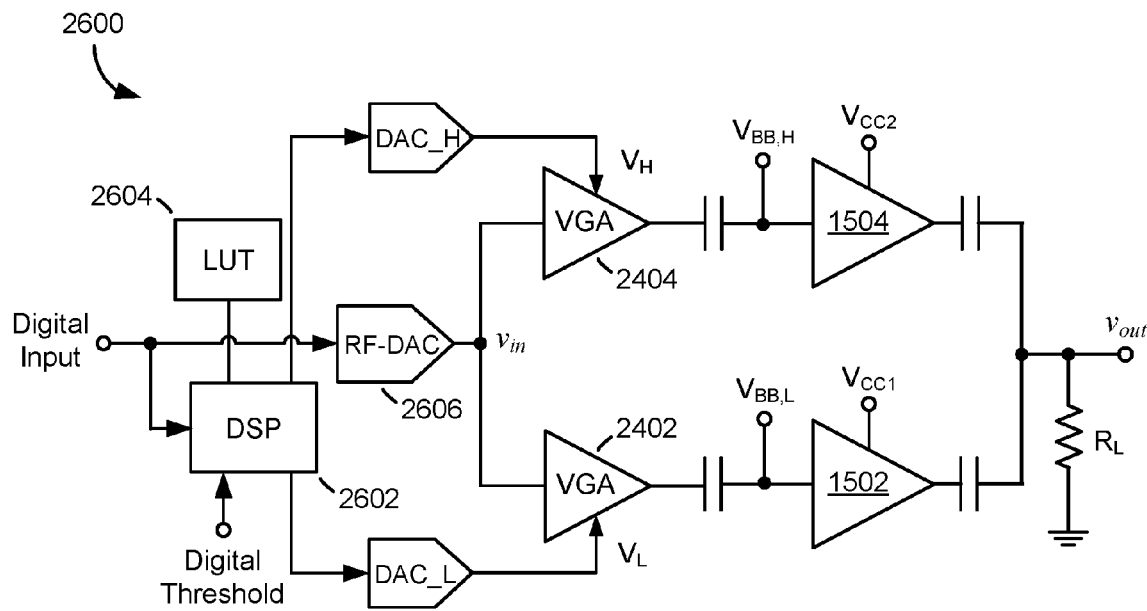
FIG. 26 is a drawing depicting an RF PA apparatus, according to an embodiment of the present invention.
Figure 27:
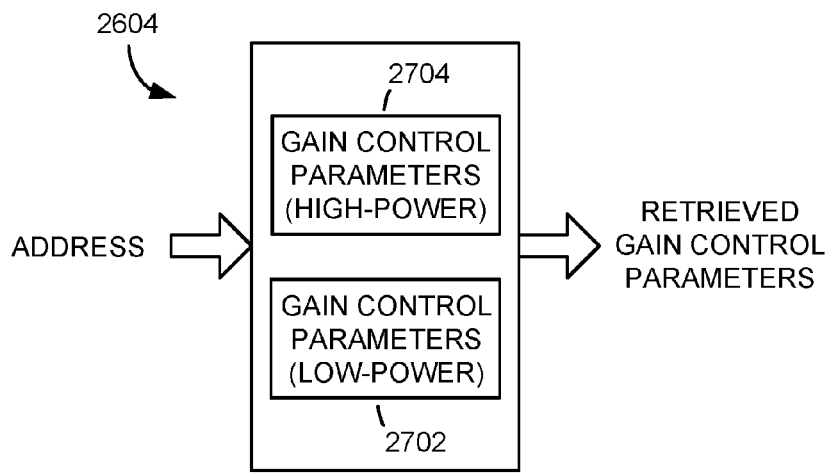
FIG. 27 is a drawing that provides a conceptual illustration of the lookup table (LUT) used in the RF PA apparatus depicted in FIG. 26.

In the RF PA apparatus 2400 an analog controller 2406 is used to control the voltage gains of the first and second VGAs 2402 and 2404. FIG. 26 is a drawing depicting an RF PA apparatus 2600, according to another embodiment of the invention, in which the voltage gains of the first and second VGAs 2402 and 2404 are digitally controlled. The RF PA apparatus includes a DSP 2602 configured to receive an input digital baseband signal. Similar to the DSP 2002 in the RF PA apparatus 2000 depicted in FIG. 20, the DSP 2602 in the RF PA apparatus 2600 operates by comparing the input digital baseband signal to a predetermined digital threshold. Also similar to the RF PA apparatus 2000, the DSP 2602 is configured to access a LUT 2604. However, rather than the LUT 2604 including a plurality of digital transition parameters that directly control the magnitudes of the digital samples being applied to first and second RF-DACs 2006 and 2008, the LUT 2604 of the RF PA apparatus 2400 includes digital gain control parameters, which the DSP 2602 selects from to control and vary the gain control voltages $V_L$ and $V_H$ being applied to the first and second VGAs 2402 and 2404. As conceptually illustrated in FIG. 27, the LUT 2604 includes a first plurality of digital gain control parameters 2702, which the DSP 2602 selects from to control and vary the gain control voltage $V_L$ being applied to the first VGA 2402 during handoff events and a second plurality of digital gain control parameters 2704, which the DSP 2602 selects from to control and vary the gain control voltage $V_H$ being applied to the second VGA 2404 during handoff events. The RF PA apparatus 2600 further includes an RF DAC 2606, which converts the input digital baseband signal to an analog signal and upconverts the analog signal to an input RF voltage $v_{in}$, which is applied to both the low-power branch and high-power branch of the RF PA apparatus 2600. During a handoff in RF power delivery from the low-power branch to the high-power branch, the DSP 2602 uses the gain control parameters it retrieves from the first plurality of gain control parameters 2702 to gradually reduce the gain control voltage $V_L$ being applied to the first VGA 2402 and, at the same time, uses the gain control parameters it retrieves from the second plurality of gain control parameters 2704 to gradually increases the gain control voltage $V_H$ being applied to the second VGA 2404. In this manner, the magnitude of the input RF voltage $v_{in,1}$ being applied to the RF input port of the low-power RF PA 1502 is gradually lowered while the magnitude of the input RF voltage $v_{in,2}$ being applied to the RF input port of the high-power RF PA 1504 is gradually increased. As the handoff from the low-power RF PA 1502 to the high-power RF PA 1504 nears completion, the value of the input RF voltage $v_{in,1}$ being applied to the RF input port of the low-power RF PA 1502 becomes so low that the low-power RF PA 1502 essentially becomes disabled, and the input RF voltage $v_{in,2}$ to the high-power RF PA 1504 is maximized, thereby allowing the high-power RF PA 1504 to take over full responsibility for delivering RF power to the load $R_L$.

It should be mentioned that because the high-power RF PA 1504 operates at higher output RF power levels than the low-power RF PA 1502, the voltage swing at the output of the high-power RF PA 1504 may at some times be greater than the power supply voltage $V_{CC1}$ applied to the low-power RF PA 1502. Since the low-power RF PA 1502 and high-power RF PA 1504 share a common output node (for example, output node 2010 in the RF PA apparatus 2000 described in reference to FIG. 20), there is a risk, depending on the voltage conditions that are present and the particular type of power transistors that are being used, that the collector-base junction of the power transistor in the low-power RF PA 1502 can become forward biased. Forward biasing the collector-base junction is undesirable since it can cause the low-power RF PA 1502 to enter reverse operation. Fortunately, there are a number of approaches that can prevent this reverse operation from occurring. One approach would be to temporarily switch the lower power supply voltage $V_{CC1}$ being applied to the power supply port of the low-power RF PA 1502 to a higher voltage (for example, to the higher supply voltage $V_{CC2}$), after the low-power RF PA 1502 has just been gradually turned off and the high-power RF PA 1504 has just become active. Another approach would be to lower the base bias voltage $V_{BB,L}$ being applied to the RF input port of the low-power RF PA 1502 during times when the high-power RF PA 1504 is active and delivering RF power to the load $R_L$. Yet another approach would be to insert a diode in the collector path of the power transistor of the low-power RF PA 1502. Any one of these possible approaches will prevent the collector-base junction from ever becoming forward biased during times when the high-power RF PA 1504 is active and delivering RF power to the load $R_L$. The collector-substrate junction of the power transistor of the low-power RF PA 1502 (or drain-substrate junction, if a FET is being used) can also be prevented from becoming forward biased by biasing the substrate to a sufficiently negative potential. Alternatively, power transistors fabricated using silicon-on-insulator (SOI) technology could be used to prevent the collector-substrate junction (or drain-substrate junction, if a FET is being used) from ever becoming forward biased.

Figure 28:
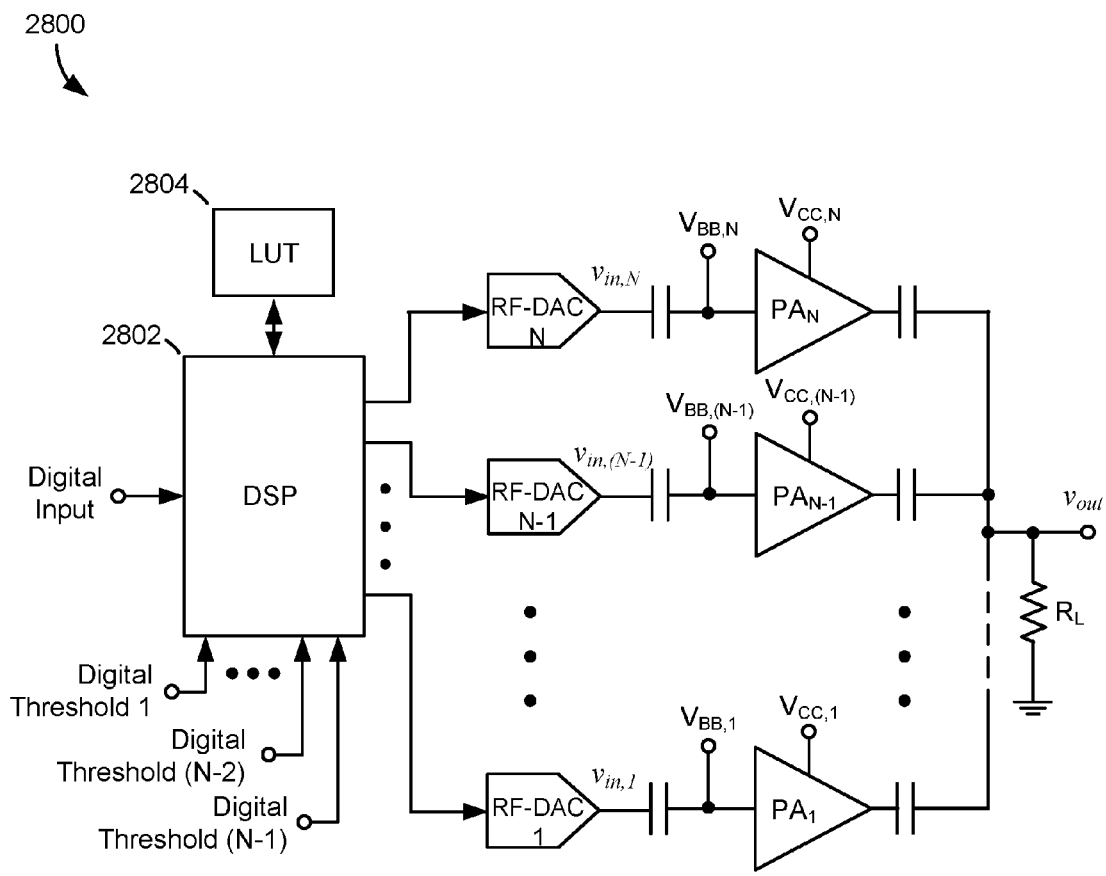
FIG. 28 is a drawing depicting an RF PA apparatus, according to an embodiment of the present invention, highlighting that it and other RF PA apparatuses of the present invention include more than two power amplifier branches.

The various embodiments of the RF PA apparatus described above each only includes two RF PA branches—the low-power branch that includes the low-power RF PA 1502 and the high-power branch that includes the high-power RF PA 1504. Any one those RF PA apparatuses (and any of the other embodiments of the RF PA apparatus of the present invention disclosed herein) may be modified to include more than two RF PA branches. FIG. 28 illustrates, for example, how the RF PA apparatus 2000 can be modified to form an RF PA apparatus 2800 that includes N RF PA branches with N corresponding RF PAs $PA_1, \ldots, PA_{(N-1)}, PA_N$, where N is an integer greater than or equal to 3 (i.e., N≥3). N progressively higher fixed DC power supply voltages $V_{CC1}, \ldots, V_{CC,(N-1)}, V_{CC,N}$ are applied to the plurality of RF PAs $PA_1, \ldots, PA_{(N-1)}, PA_N$, i.e., such that $V_{CC,N} > V_{CC,(N-1)} >, \ldots, V_{CC1}$. With the progressively higher DC power supply voltages $V_{CC,N} > V_{CC,(N-1)} >, \ldots, V_{CC1}$ applied, the first RF PA ($PA_1$) serves to deliver RF power to the load $R_L$ over a first range of output RF power levels; the second RF PA ($PA_2$) serves to deliver RF power to the load $R_L$ over a second range of output RF power levels higher than the first range of output RF power levels; the third RF PA ($PA_3$) serves to deliver RF power to the load $R_L$ over a third range of output RF power levels higher than the second range of output RF power levels; and so on. The DSP 2802 is configured to control which of the plurality of RF PAs $PA_1, \ldots, PA_{(N-1)}, PA_N$ is delivering RF power to the load $R_L$. It is also responsible for coordinating handoffs between the various branches of the RF PA apparatus 2800, by comparing the value of the input digital baseband signal to a plurality of digital threshold voltages: Digital Threshold 1, . . . , Digital Threshold (N−2), Digital Threshold (N−1). For example, when the Nth RF PA ($PA_N$) is delivering RF power to the load $R_L$ and the DSP 2802 determines that the input digital baseband signal has fallen to a value lower than Digital Threshold (N−1), the DSP 2802 retrieves digital transition parameters from a LUT 2804 to gradually effect a handoff in power delivery from the Nth RF PA ($PA_N$) to the (N−1)th RF PA ($PA_{N-1}$). As the input digital baseband signal falls to even lower values, for example, to a value less than the (N−2)th Digital Threshold (N−2), the DSP 2802 retrieves digital transition parameters from the LUT 2804 to gradually effect a handoff in power delivery from the (N−1)th RF PA ($PA_{N-1}$) to the (N−2)th RF PA ($PA_{N-2}$). The exemplary N-branch RF PA apparatus 2800 depicted in FIG. 28 is but one example of how one of the various RF PA apparatuses of the present invention can be modified to include more than two RF PA branches. Those of ordinary skill in the art will readily appreciate and understand with the benefit of this disclosure that the other two-branch embodiments of the present invention disclosed herein may also be extended to more than two RF PA branches.

Figure 29:
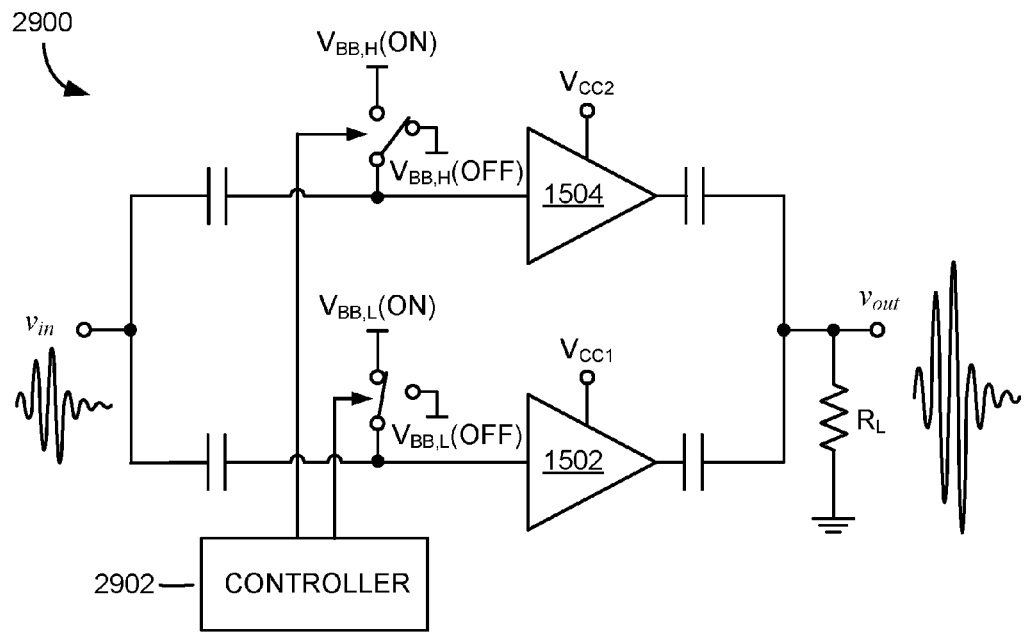
FIG. 29 is a drawing depicting an RF PA apparatus, according to an embodiment of the present invention.

In the various embodiments of the RF PA apparatus described above, handoffs between the low-power and high-power branches is performed by switching the input RF voltage $v_{in}$ between the two branches or by controlling the magnitudes of the input RF voltages $v_{in,1}$ and $v_{in,2}$ applied to the two branches. FIG. 29 is a drawing depicting an RF PA apparatus 2900, in accordance with another embodiment of the invention, in which the DC bias voltages are manipulated and controlled to perform handoffs between the low-power and high-power branches. Similar to the other RF PA apparatuses disclosed herein, the RF PA apparatus 2900 has a low-power RF PA 1502 with a power supply port configured to receive a first constant DC power supply voltage $V_{CC1}$ and a high-power RF PA 1504 with a power supply port configured to receive a second constant DC power supply voltage $V_{CC2}$ that is greater than the first constant DC power supply voltage $V_{CC1}$, i.e., $V_{CC2} > V_{CC2}$. However, rather than including a controller that switches the input RF voltage $v_{in}$ between the low-power and high-power branches or which manipulates the magnitudes of the input RF voltages $v_{in,1}$ and $v_{in,2}$ being applied to two branches to perform a handoff, the RF PA apparatus 2900 employs a controller 2902 that controls the input bias voltages $V_{BB,L}$ and $V_{BB,H}$ applied to the low-power and high-power RF PAs 1502 and 1504 to control handoffs between the two branches. During low-power operating conditions the controller 2902 sets the input bias voltage $V_{BB,L}$ at the RF input port of the low-power RF PA 1502 to a value $V_{BB,L} = V_{BB,L}(ON)$ and sets the input bias voltage $V_{BB,H}$ at the RF input port of the high-power RF PA 1504 to a value $V_{BB,H} = V_{BB,H}(OFF)$. The "ON" designation used in $V_{BB,L}(ON)$ is used indicate that the input bias voltage being applied to the RF input port of the low-power RF PA 1502 is sufficient to bias the low-power RF PA 1502 as a Class-A, B, AB or C RF PA, so that the low-power RF PA 1502 is active and able to deliver power to the load $R_L$. The "OFF" designation in $V_{BB,H}(OFF)$ is used to indicate that the input bias voltage being applied to the RF input port of the high-power RF PA 1504 is sufficiently low to render the high-power RF PA 1504 inactive and unable to deliver RF power to the load $R_L$. At higher output RF power levels, when only the high-power RF PA 1504 is active and delivering RF power to the load $R_L$, the controller 2902 reverses the biasing scheme, setting the input bias voltage $V_{BB,L}$ at the RF input port of the low-power RF PA 1502 to a value $V_{BB,L} = V_{BB,L}(OFF)$ and the input bias voltage $V_{BB,H}$ at the RF input port of the high-power RF PA 1504 to a value $V_{BB,H} = V_{BB,H}(ON)$. With $V_{BB,H} = V_{BB,H}(ON)$ the high-power RF PA 1502 becomes active and takes over RF power delivery to the load $R_L$, and with $V_{BB,L} = V_{BB,L}(OFF)$ the low-power RF PA 1502 is rendered inactive and unable to deliver RF power to the load $R_L$.

Figure 30:
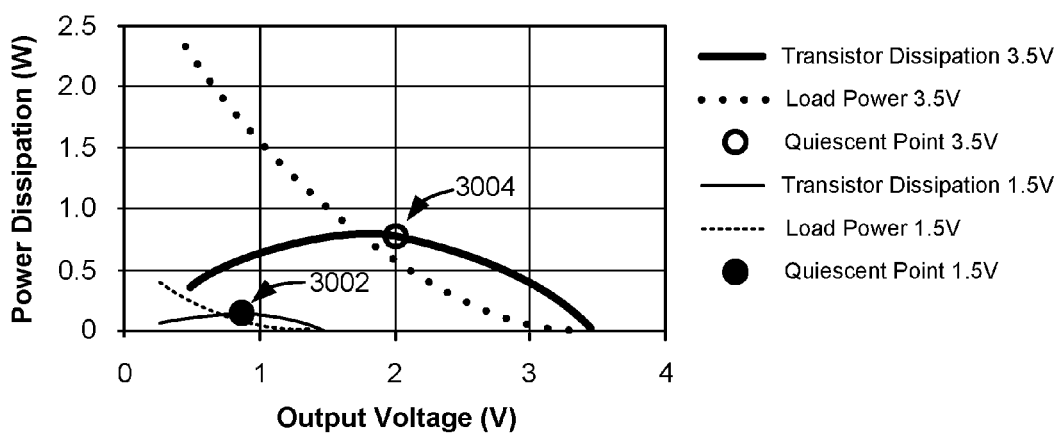
FIG. 30 is a power dissipation versus output voltage plot of the RF PA apparatus depicted in FIG. 29.

FIG. 30 is a plot showing the power dissipation profile of the RF PA apparatus 2900, for a situation where the low-power RF PA 1502 and high-power RF PA 1504 is each biased for Class-A operation when active an delivering power to the load $R_L$. The filled circle 3002 in the power dissipation profile represents the quiescent point (i.e., DC operating point) of the low-power RF PA 1502 during times it is active and delivering power to the load $R_L$ (i.e., when the controller 2902 of the RF PA apparatus 2900 has adjusted the input bias voltage $V_{BB,L}$ to the low-power RF PA 1502 to $V_{BB,L} = V_{BB,L}(ON)$). The unfilled circle 3004 represents the DC operating point of the high-power RF PA 1504 during times it is active and delivering power to the load $R_L$ (i.e., when the controller 2902 has adjusted the input bias voltage $V_{BB,H}$ to the high-power RF PA 1504 to $V_{BB,H} = V_{BB,H}(ON)$).

In addition to illustrating the location of the DC operating points 3002 and 3004 of the low-power and high-power RF PAs 1502 and 1504, the power dissipation profile in FIG. 30 reveals the high conversion efficiency that the RF PA apparatus 2900 is able to realize at backed-off power levels. At backed-off power levels and when the low-power RF PA 1502 is active and delivering RF power to the load $R_L$, the controller 1506 sets the input bias voltage $V_{BB,H}$ at the RF input port of the high-power RF PA 1504 to $V_{BB,H} = V_{BB,H}(OFF)$. The conversion efficiency of the RF PA apparatus 2900 at backed-off power levels when the low-power RF PA 1502 is active and delivering RF power to the load $R_L$ is therefore determined entirely by the power that is being dissipated by the low-power RF PA 1502. As can be seen in FIG. 30, the quiescent power dissipation of the low-power RF PA 1502 (indicated by the filled circle 3002) is much lower than the quiescent power dissipation of the high-power RF PA 1504 (indicated by the unfilled circle 3004) during times when the high-power RF PA 1504 is responsible for delivering RF power to the load $R_L$. The much lower power dissipation of the low-power RF PA 1502 at backed off power levels is due to the fact that its power supply voltage $V_{CC1}$ is smaller than the power supply voltage $V_{CC2}$ of the high-power RF PA 1504, and smaller than that which would be required if the low-power RF PA 1502 was required to operate over the full dynamic range of output RF power levels that the RF PA apparatus 2900 as a whole operates. In other words, if the high-power RF PA 1504 was not available to extend the dynamic range of output RF power levels beyond that provided by the low-power RF PA 1502, the low-power RF PA 1502 would require a power supply voltage at least as high as $V_{CC2}$ in order deliver RF power to the load $R_L$ over the same dynamic range of output RF power levels that the RF PA apparatus 2900 does. However, because the high-power RF PA 1504 is available and the low-power RF PA 1502 can use a lower power supply voltage $V_{CC1}$, the power dissipated by the RF PA apparatus 2900 at backed-off power levels when the low-power RF PA 1502 is delivering power to the load is much lower than is dissipated in prior art RF PA apparatuses powered by a single power supply and operating over the same dynamic range of output RF power levels that the RF PA apparatus 2900 as a whole operates. Further, since the maximum conversion efficiency η an RF PA apparatus can achieve depends directly on the power that its power transistor dissipates, the RF PA apparatus 2900 is able to realize a much higher maximum conversion efficiency at backed-off power levels than can be possibly achieved by a prior art RF PA powered by a single power supply and operating over the same dynamic range of output RF power levels that the RF PA apparatus 2900 operates. Simulations have also shown that when the low-power and high-power RF PAs 1502 and 1504 are biased for Class-B operation when active and delivering RF power to the load $R_L$, the RF PA apparatus 2900 has a conversion efficiency profile that is very similar to the conversion efficiency profile (see FIG. 16) of the RF PA apparatus 1500 described above in reference to FIG. 15.

Figure 31:
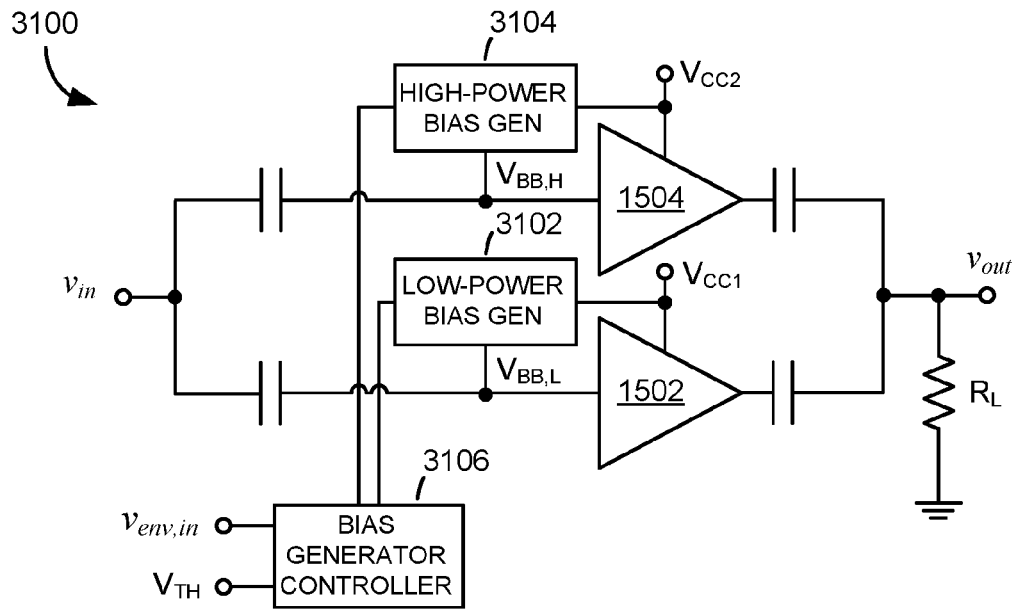
FIG. 31 is a drawing depicting an RF PA apparatus, according to an embodiment of the present invention.

Like the other RF PA apparatuses described herein, the controller 2902 of the RF PA apparatus 2900 may be constructed using analog circuitry, digital circuitry or a combination of analog and digital circuitry. Additionally, the controller 2902 can be designed so that handoffs between the low-power RF PA 1502 and high-power RF PA 1504 are performed gradually (i.e. smoothly). As was explained above, a gradual handoff between the low-power and high-power branches is often preferable since it can better facilitate linear operation during the handoff and can reduce the possibility of transients developing during the handoff. FIG. 31 is a drawing depicting an RF PA apparatus 3100 that provides this gradual handoff capability, in accordance with another embodiment of the present invention. Like the RF PA apparatus 2900 depicted in FIG. 29, the RF PA apparatus 3100 includes a low-power RF PA 1502, which is powered by a first power supply that supplies a first constant DC power supply voltage $V_{CC1}$, and a high-power RF PA 1504, which is powered by a second power supply that supplies a second constant DC power supply voltage $V_{CC2}$ greater than the first DC power supply voltage (i.e., $V_{CC2} > V_{CC2}$). How-ever, rather than including a controller 2902 that switches the input bias voltages $V_{BB,L}$ and $V_{BB,H}$ between two distinct states in performing handoffs between the low-power and high-power RF PAs 1502 and 1504, the RF PA apparatus 3100 includes a bias generator controller 3106 and low-power and high-power bias generators 3102 and 3102 that gradually adjust the input bias voltages $V_{BB,L}$ and $V_{BB,H}$ during handoff events.

Figure 32:
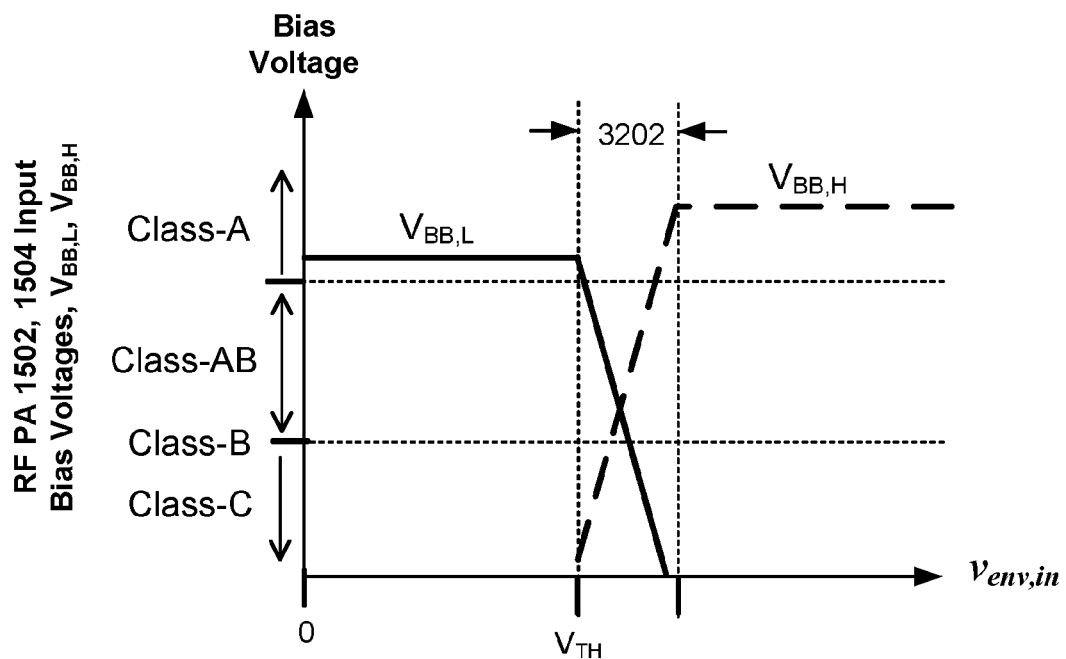
FIG. 32 is a signal diagram illustrating how the bias voltages $V_{BB,L}$ and $V_{BB,H}$ applied to the low-power RF PA and high-power RF PA of the RF PA apparatus in FIG. 31 can be gradually adjusted as power delivery to a load is handed off from the low-power RF PA to the high-power RF PA.

FIG. 32 is a signal diagram illustrating how the low-power and high-power bias generators 3102 and 3102, under the direction of the bias generator controller 3106, gradually vary the input bias voltages $V_{BB,L}$ and $V_{BB,H}$ being applied to the RF input ports of the low-power and high-power RF PAs 1502 and 1504, in order to effect a handoff from the low-power branch of the RF PA apparatus 3100 to the high-power branch. As long as the magnitude of the signal envelope voltage $v_{env,in}$ remains less than the threshold voltage $V_{TH}$, the input bias voltage $V_{BB,L}$ is maintained at a level that allows the low-power RF PA 1502 to deliver RF power to the load $R_L$ and the input bias voltage $V_{BB,H}$ is maintained at a voltage that maintains the high-power RF PA 1504 in an OFF condition. (Note that in this example the low-power and high-power RF PAs 1502 1504 is each biased for Class-A operation when active and delivering RF power to the load and when operating outside the handoff region 3202. They could be alternatively biased for Class-B, AB or C operation during those times.) However, upon the bias generator controller 3106 detecting that the magnitude of the input signal envelope voltage $v_{env,in}$ has risen to a value that exceeds the threshold voltage $V_{TH}$, handoff from the low-power RF PA 1502 to the high-power RF PA 1504 is initiated. Specifically, the bias generator controller 3106 directs the low-power bias generator 3102 to gradually reduce the input bias voltage $V_{BB,L}$ it is applying to the base of the low-power RF PA 1502 and, during the same time, directs the high-power bias generator 3104 to gradually increase the input bias voltage $V_{BB,H}$ it is applying to the base of the high-power RF PA 1504. The input bias voltage $V_{BB,H}$ eventually reaches a magnitude that allows the high-power RF PA 1502 to become active (operating as a Class-A RF PA in this example), and the magnitude of the input bias voltage $V_{BB,L}$ is eventually lowered to a value that causes the low-power RF PA 1502 to turn off. Adjusting the bias voltages in this manner thus results in a handoff of RF power delivery from the low-power branch of the RF PA apparatus 3100 to the high-power branch.

Figure 33:
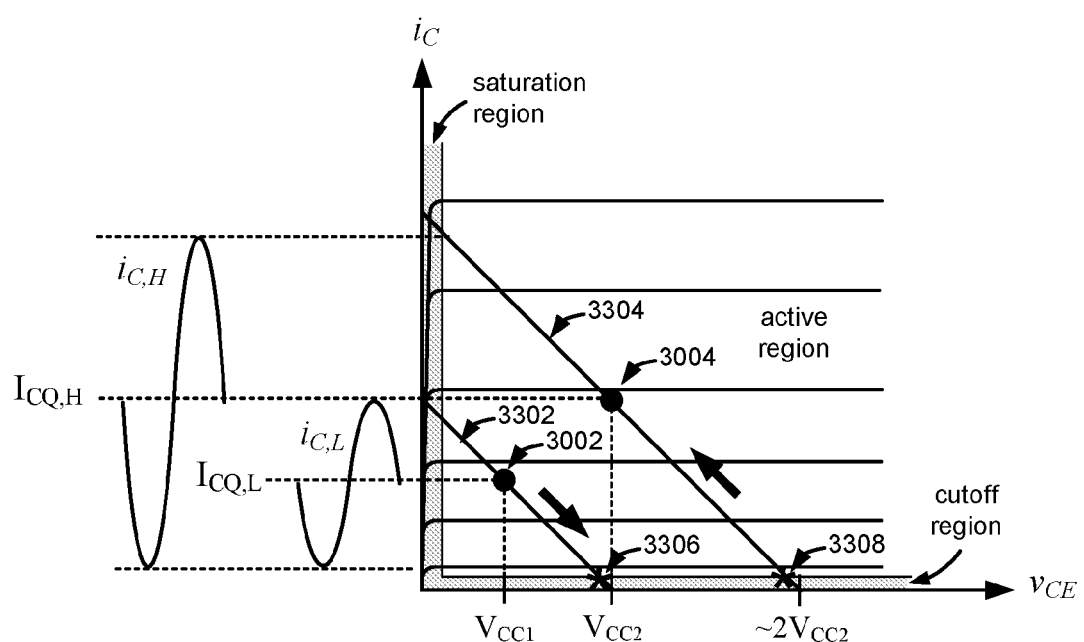
FIG. 33 is a drawing of current versus voltage (I-V) characteristics of the power transistors used in the low-power and high-power RF PAs of the RF PA apparatus depicted in FIG. 31, highlighting the handoff process that is performed between the low-power RF PA and the high-power RF PA.

The process of handing off RF power delivery from the low-power branch of the RF PA apparatus 3100 to the high-power branch can be further understood by referring to the I-V characteristic curves in FIG. 33. The load line 3302 drawn over the I-V characteristic curves is the load line for the low-power RF PA 1502. The load line 3304 is the load line for the high-power RF PA 1504. (Note that in this example it is assumed that $V_{CC1} = V_{CC2}/2$, that the power transistors used in the low-power and high-power RF PA 1502 and 1504 have the same operating characteristics, and that the low-power and high-power RF PAs 1502 and 1504 is each biased for Class-A operation when active and delivering power to the load $R_L$. These assumptions are not necessary conditions, insofar as the invention is concerned.) So long as the magnitude of the input signal envelope voltage $v_{env,in}$ remains less than the threshold voltage $V_{TH}$, the low-power RF PA 1502 remains active and delivers RF power to the load $R_L$, operating along the load line 3302 about quiescent point 3002, and the high-power RF PA 1504 is biased so that it remains off at cut-off point 3308. However, upon the magnitude of the input signal envelope voltage $v_{env,in}$ increasing to a value that exceeds the threshold voltage $V_{TH}$, the bias generator controller 3106 begins directing the low-power bias generator 3102 to gradually lower the input bias voltage $V_{BB,L}$ it is applying to the low-power RF PA 1502. This results in the operating point of the low-power RF PA 1502 gradually moving from quiescent point 3002, down the low-power RF PA 1502 load line 3302, and finally to cut-off point 3306, where the low-power RF PA 1502 cuts off. In effect, and as indicated along the vertical axis of drawing in FIG. 32, the gradual lowering of the input bias voltage $V_{BB,L}$ results in the low-power RF PA 1502 progressively changing conducting classes—from Class-A, to Class-AB, to Class-B, to Class-C and eventually to a point that causes the low-power RF PA 1502 cut off. During the same time that the bias generator controller 3106 is directing the low-power bias generator 3102 to gradually lower the input bias voltage $V_{BB,L}$, the bias generator controller 3106 also directs the high-power bias generator 3104 to gradually increase the input bias voltage $V_{BB,H}$ it is applying to the high-power RF PA 1504. As illustrated in FIG. 33, this results in the operating point of the high-power RF PA 1504 gradually moving from cut-off point 3308, up the high-power RF PA 1504 load line 3304, and finally to operating point 3004. In effect, and as indicated along the vertical axis of drawing in FIG. 32, the gradual increase of the input bias voltage $V_{BB,H}$ results in the high-power RF PA 1502 progressively changing conducting classes—from Class-C, to Class-B, to Class-AB, and finally to Class-A. Once the handoff from the low-power RF PA 1502 to the high-power RF PA 1504 has completed, the high-power RF PA 1504 continues operating as a Class-A RF PA and the low-power RF PA 1502 continues to remain off until the bias generator controller 3106 detects that the magnitude of the input signal envelope voltage $v_{env,in}$ has subsequently fallen to a magnitude less than the threshold voltage $V_{TH}$. Upon that condition occurring, the bias generator controller 3106 commences coordinating a new handoff process in the reverse direction from that described above, so that the low-power RF PA 1502 once again becomes active and the high-power RF PA 1504 turns off.

Figure 34:
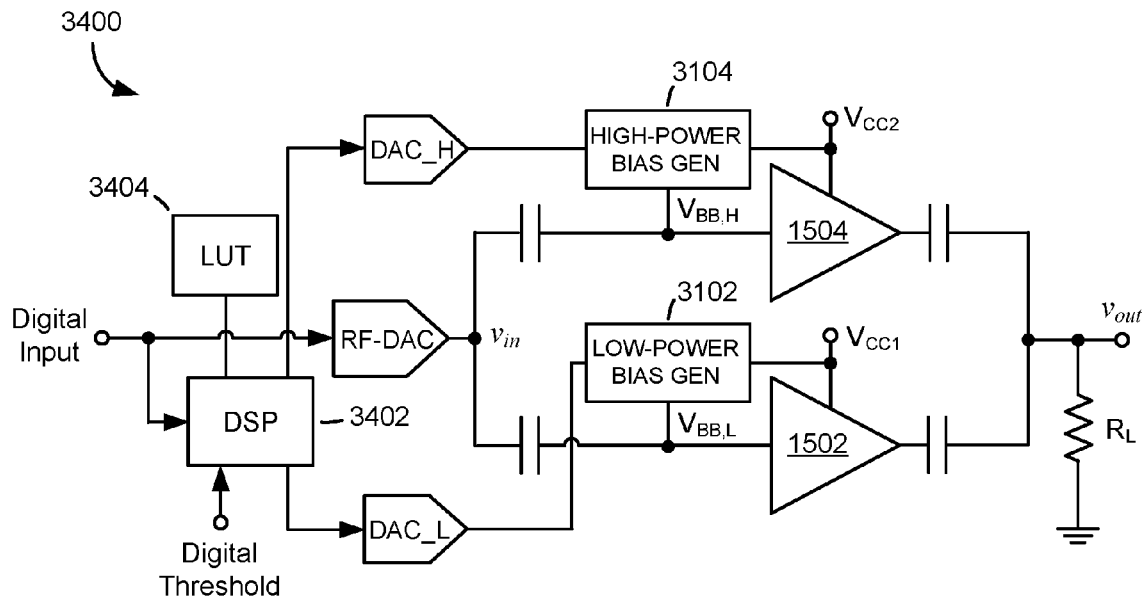
FIG. 34 is a drawing depicting an RF PA apparatus, according to an embodiment of the present invention.
Figure 35:
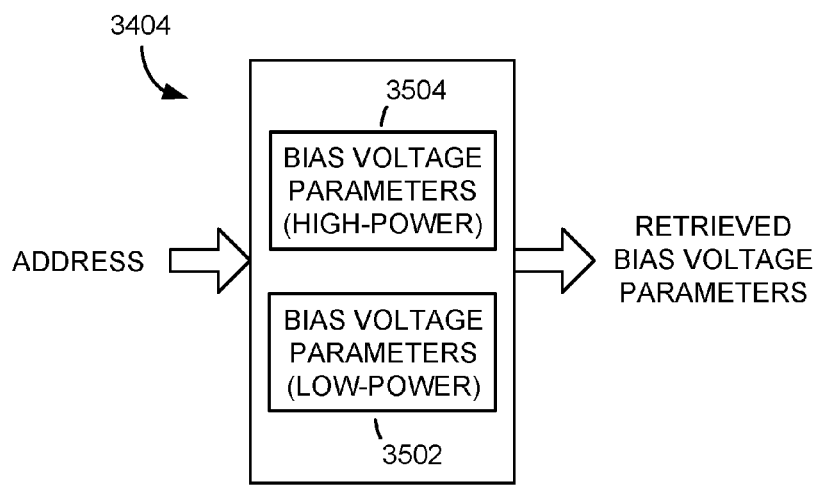
FIG. 35 is a drawing that provides a conceptual illustration of the LUT used in the RF PA apparatus depicted in FIG. 34.

FIG. 34 is a drawing of an RF PA apparatus 3400 similar to the RF PA apparatus 3100 depicted in FIG. 31, but in which handoffs between the low-power and high-power RF PAs 1502 and 1504 are gradually controlled at baseband using a DSP 3402 and LUT 3404. The DSP 3402 operates similar to the DSP 2602 in the RF PA apparatus 2600 described above in reference to FIG. 26, except that the LUT 3404 includes first and second pluralities of digital bias voltage parameters 3502 and 3504 (see FIG. 35), which the DSP 3402 selects from and uses to gradually vary the input bias voltages $V_{BB,L}$ and $V_{BB,H}$ being applied to the bases of the low-power and high-power RF PAs 1502 and 1504 when coordinating handoffs between the low-power and high-power RF PAs 1502 and 1504.

While various embodiments of the present invention have been presented, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments of the invention but, instead, should be determined by the appended claims, including the full scope of equivalents to which such claims are entitled.

What is claimed is:

1. A radio frequency power amplifier (RF PA) apparatus, comprising:
   a first RF PA having an RF input port, a first power supply port configured to receive a first power supply voltage, and an RF output port, the first RF PA operable to deliver RF power to a load over a first range of output RF power levels;
   a second RF PA having an RF input port, a second power supply port configured to receive a second power supply voltage greater than the first power supply voltage, and an RF output port, the second RF PA operable to deliver RF power to the load over a second range of output RF power levels greater than the first range of output RF power levels;
   a first DC blocking capacitor coupled between the RF output port of the first RF PA and an output node of the RF PA apparatus;
   a second DC blocking capacitor coupled between the RF output port of the second RF PA and the output node of the RF PA apparatus; and
   a controller configured to facilitate gradual handoffs of RF power delivery between the first and second RF PAs during handoff events and control the first and second RF PAs so that a composite RF output voltage produced at the output node of the RF PA apparatus during any given handoff event remains substantially linear with respect to an RF input voltage over the duration of the any given handoff event.

2. The RF PA apparatus of claim 1, wherein the RF PA apparatus does not employ load modulation when the first RF PA is delivering RF power to the load over the first range of output RF power levels.

3. The RF PA apparatus of claim 1, wherein, after a handoff of RF power delivery from the first RF PA to the second RF PA, the controller is configured to maintain the first RF PA in a disabled state and allow only the second RF PA to deliver RF power to the load.

4. The RF PA apparatus of claim 1, wherein the controller is configured to commence facilitating a gradual handoff between the first and second RF PAs depending on a magnitude of a signal envelope of the RF input voltage or upon detecting or determining that a magnitude of a signal envelope of the RF input voltage has traversed a predetermined threshold voltage.

5. The RF PA apparatus of claim 1, wherein the controller is configured to commence facilitating a gradual handoff between the first and second RF PAs depending on a value of an input digital signal or upon detecting or determining that a value of an input digital signal has traversed a predetermined digital threshold.

6. The RF PA apparatus of claim 1, wherein the controller is configured to control whether the RF input voltage is directed to the RF input port of the first RF PA or is directed to the RF input port of the second RF PA.

7. The RF PA apparatus of claim 6, wherein, upon facilitating a gradual handoff from the first RF PA to the second RF PA, the controller is further configured to gradually transition the RF input voltage from being applied to the RF input port of the first RF PA to being applied to the RF input port of the second RF PA.

8. The RF PA apparatus of claim 1, wherein the controller is configured to control a magnitude of a first input RF voltage applied to the RF input port of the first RF PA and a magnitude of a second input RF voltage applied to the RF input port of the second RF PA.

9. The RF PA apparatus of claim 8, wherein, upon facilitating a gradual handoff of RF power delivery from the first RF PA to the second RF PA the controller is further configured to gradually reduce the magnitude of the first input RF voltage applied to the RF input port of the first RF PA and gradually increase the magnitude of the second input RF voltage applied to the RF input port of the second RF PA.

10. The RF PA apparatus of claim 1, wherein the controller comprises:
a first variable bias voltage generator configured to generate and apply a first variable bias voltage to the RF input port of the first RF PA;
a second variable bias voltage generator configured to generate and apply a second variable bias voltage to the RF input port of the second RF PA; and
a bias generator controller configured to direct how the first and second variable bias voltage generators vary their respective first and second bias voltages during handoff events.

11. The RF PA apparatus of claim 10, wherein, upon facilitating a gradual handoff of RF power delivery from the first RF PA to the second RF PA the bias generator controller is configured to direct the first bias voltage generator to gradually reduce the magnitude of the first input bias voltage applied to the RF input port of the first RF PA and direct the second bias voltage generator to gradually increase the magnitude of the second input bias voltage applied to the RF input port of the second RF PA.

12. A method of delivering radio frequency (RF) power to a load, comprising:
applying a first constant DC power supply voltage to a power supply port of a first RF power amplifier (RF PA) responsible for delivering RF power to a load over a first range of output RF power levels;
applying a second constant DC power supply voltage greater than the first constant DC power supply voltage to a power supply port of a second RF PA responsible for delivering RF power to the load over a second range of output RF power levels greater than the first range of output RF power levels;
gradually handing off responsibility for delivering RF power to the load from the first RF PA to the second RF PA during a handoff event;
forming a composite RF output voltage from first and second RF output voltages produced by the first and second RF PAs during the handoff event; and
controlling the first and second RF PAs so that the composite RF output voltage remains substantially linear with respect to an RF input voltage over the duration of the handoff event.

13. The method of claim 12, wherein gradually handing off responsibility for delivering RF power to the load from the first RF PA to the second RF PA comprises gradually preventing the first RF PA from delivering RF power to the load while gradually allowing the second RF PA to deliver RF power to the load.

14. The method of claim 13, wherein gradually preventing the first RF PA from delivering RF power to the load and gradually allowing the second RF PA to deliver RF power to the load comprises gradually transitioning the RF input voltage from an RF input port of the first RF PA to an RF input port of the second RF PA.

15. The method of claim 13, wherein gradually preventing the first RF PA from delivering RF power to the load and gradually allowing the second RF PA to deliver RF power to the load comprises gradually reducing a magnitude of a first input RF voltage applied to an RF input port of the first RF PA and gradually increasing a magnitude of a second input RF voltage applied to an RF input port of the second RF PA.

16. The method of claim 13, wherein gradually preventing the first RF PA from delivering RF power to the load and gradually allowing the second RF PA to deliver RF power to the load comprises gradually reducing a first input bias voltage applied to an RF input port of the first RF PA and gradually increasing a second input bias voltage applied to an RF input port of the second RF PA.

17. The RF PA apparatus of claim 1, wherein the controller comprises:
a first RF digital-to-analog converter (RF-DAC) having an analog output coupled to the RF input port of the first RF PA;
a second RF-DAC having an analog output coupled to the RF input port of the second RF PA; and
a digital selection circuit configured to direct an input digital baseband signal to either a digital input of the first RF-DAC or a digital input of the second RF-DAC.

18. The RF PA apparatus of claim 1, wherein the controller comprises:
a digital signal processor (DSP) configured to receive an input digital signal;
a memory configured to store a lookup table (LUT) including a plurality of digital transition parameters;
a first RF digital-to-analog converter (RF-DAC) having an analog output coupled to the RF input port of the first RF PA; and
a second RF-DAC having an analog output coupled to the RF input port of the second RF PA,
wherein the DSP is configured to retrieve digital transition parameters from the LUT and apply the retrieved digital transition parameters to digital inputs of the first and second RF-DACs during handoff events to facilitate gradual handoffs of RF power delivery between the first and second RF PAs.

19. The RF PA apparatus of claim 1, wherein the second RF PA is configured to operate as a Class-A or Class-AB RF PA following a handoff of RF power from the first RF PA to the second RF PA and the first RF PA is configured to operate as a Class-A or Class-AB RF PA following a handoff of RF power delivery from the second RF PA to the first RF PA.

20. The RF PA apparatus of claim 1, wherein the time it takes for the controller to facilitate a gradual handoff of RF power delivery between the first RF PA and the second RF PA is set to realize a desired or required combination of back-off power efficiency and transient suppression capability.

21. The method of claim 12, further comprising:
receiving an input digital signal; and
directing the input digital signal to either a digital input of a first digital-to-analog converter (RF-DAC) having an analog output coupled to an RF input port of the first RF PA or to a digital input of a second RF-DAC having an analog output coupled to an RF input port of the second RF PA, depending on whether the first RF PA or the second RF PA is responsible for delivering RF power to the load.

22. The method of claim 21, further comprising directing the input digital signal to the digital input of the second RF-DAC and preventing the input digital signal from being applied to digital input of the second RF-DAC depending on a value of the input digital signal or upon detecting or determining that a value of the input digital signal has traversed a predetermined digital threshold.

23. The method of claim 12, further comprising:
  directing a first input digital signal to a digital input of a first digital-to-analog RF digital-to-analog converter (RF-DAC) having an analog output coupled to an RF input port of the first RF PA;
  directing a second input digital signal to a digital input of a second RF-DAC having an analog output coupled to an RF input port of the second RF PA; and
  gradually reducing a digital value of the first input digital signal while gradually increasing a value of the second digital signal to facilitate the gradual hand off of RF power delivery from the first RF PA to the second RF PA.

24. The method of claim 12, further comprising configuring the second RF PA to operate as a Class-A or Class-AB RF PA following the handoff of RF power delivery from the first RF PA to the second RF PA.

25. The method of claim 12, wherein the first RF PA includes a bipolar junction transistor (BJT) and the method further comprises preventing the base-collector junction of the BJT from becoming forward biased upon and when responsibility for delivering RF power to the load is being handed off from the first RF PA to the second RF PA.

26. The method of claim 12, wherein the first RF PA includes a bipolar junction transistor (BJT) or a field-effect transistor (FET) and the method further comprises preventing a collector-substrate junction of the BJT or a drain-substrate junction of the FET from becoming forward biased upon and when responsibility for delivering RF power to the load is being handed off from the first RF PA to the second RF PA.

27. The method of claim 12, further comprising controlling a time it takes to facilitate a gradual handoff between the first RF PA and the second RF PA and thereby realize a desired or required combination of back-off power efficiency and transient suppression capability.

28. The method of claim 12, wherein forming the composite RF output voltage comprises:
  coupling a first RF output voltage produced at an RF output port of the first RF PA through a first DC blocking capacitor to produce a first AC-coupled RF output voltage;
  coupling a second RF output voltage produced at an RF output port of the second RF PA through a second DC blocking capacitor to produce a second AC-coupled RF output voltage; and
  combining the first and second AC-coupled RF output voltages to form the composite RF output voltage.

* * * * *